(12) United States Patent
Stoicescu et al.

(10) Patent No.: US 11,815,414 B2
(45) Date of Patent: Nov. 14, 2023

(54) PRESSURE SENSOR DEVICES AND METHODS FOR MANUFACTURING PRESSURE SENSOR DEVICES

(71) Applicant: Infineon Technologies AG, Neubiberg (DE)

(72) Inventors: Emanuel Stoicescu, Bucharest (RO); Matthias Boehm, Putzbrunn (DE); Stefan Jahn, Munich (DE); Erhard Landgraf, Dresden (DE); Michael Weber, Mainburg (DE); Janis Weidenauer, Munich (DE)

(73) Assignee: Infineon Technologies AG, Neubiberg (DE)

( * ) Notice: Subject to any disclaimer, the term of this patent is extended or adjusted under 35 U.S.C. 154(b) by 91 days.

(21) Appl. No.: 17/348,940

(22) Filed: Jun. 16, 2021

(65) Prior Publication Data
US 2021/0310890 A1    Oct. 7, 2021

Related U.S. Application Data

(63) Continuation of application No. 16/159,918, filed on Oct. 15, 2018, now Pat. No. 11,067,466.

(30) Foreign Application Priority Data

Oct. 17, 2017   (DE) .......................... 102017124092.6
Mar. 20, 2018   (DE) .......................... 102018106560.4

(51) Int. Cl.
*G01L 19/14*    (2006.01)
*H01L 23/053*    (2006.01)
(Continued)

(52) U.S. Cl.
CPC ........ *G01L 19/147* (2013.01); *G01L 19/0061* (2013.01); *H01L 21/56* (2013.01);
(Continued)

(58) Field of Classification Search
CPC ......... G01L 19/147; G01L 2248/48091; H01L 2224/48091; H01L 2224/48247;
(Continued)

(56) References Cited

U.S. PATENT DOCUMENTS 5,173,766 A * 12/1992 Long ...................... H01L 23/24
                                                               257/668
2003/0214026 A1* 11/2003 Tokuhara ................ H01L 23/13
                                                               257/692
(Continued)

*Primary Examiner* — Samuel A Gebremariam
*Assistant Examiner* — Jonas T Beardsley
(74) *Attorney, Agent, or Firm* — Harrity & Harrity, LLP

(57) ABSTRACT

A pressure sensor device includes a semiconductor die having a die surface that includes a pressure sensitive area; and a bond wire bonded to a first peripheral region of the die surface and extends over the die surface to a second peripheral region of the die surface, wherein the pressure sensitive area is interposed between the second peripheral region and the first peripheral region, wherein the bond wire comprises a crossing portion that overlaps an area of the die surface, and wherein the crossing portion extends over the pressure sensitive area that is interposed between the first and the second peripheral regions.

14 Claims, 19 Drawing Sheets

(51) Int. Cl.
*G01L 19/00* (2006.01)
*H01L 21/56* (2006.01)
*H01L 23/24* (2006.01)
*H01L 23/495* (2006.01)
*H01L 23/60* (2006.01)
*H01L 23/00* (2006.01)

(52) U.S. Cl.
CPC ............ *H01L 23/053* (2013.01); *H01L 23/24* (2013.01); *H01L 23/49548* (2013.01); *H01L 23/49575* (2013.01); *H01L 23/60* (2013.01); *H01L 24/45* (2013.01); *H01L 2224/4813* (2013.01); *H01L 2224/4848* (2013.01); *H01L 2224/48091* (2013.01); *H01L 2224/48247* (2013.01); *H01L 2224/48465* (2013.01); *H01L 2924/00014* (2013.01)

(58) Field of Classification Search
CPC ................... H01L 24/48; H01L 24/45; H01L 2224/48227; H01L 2223/6677
See application file for complete search history.

(56) References Cited

U.S. PATENT DOCUMENTS

| | | | | |
|---|---|---|---|---|
| 2007/0103380 | A1* | 5/2007 | Weste | H01Q 7/00 29/841 |
| 2012/0132937 | A1* | 5/2012 | Chan | H01L 25/0753 257/E33.059 |
| 2014/0374848 | A1* | 12/2014 | Koh | H01L 23/315 257/415 |
| 2015/0369682 | A1* | 12/2015 | Nakajima | G01L 19/143 73/384 |
| 2017/0176278 | A1* | 6/2017 | Chen | G01L 19/148 |
| 2018/0172531 | A1* | 6/2018 | Nishiyama | H05K 3/32 |

* cited by examiner

PRESSURE SENSOR DEVICES AND METHODS FOR MANUFACTURING PRESSURE SENSOR DEVICES

CROSS-REFERENCE TO RELATED APPLICATIONS

This application is a continuation of U.S. patent application Ser. No. 16/159,918 filed Oct. 15, 2018, which claims the benefit of German Patent Application No. 102017124092.6 filed Oct. 17, 2017 and German Patent Application No. 102018106560.4 filed Mar. 20, 2018, which are incorporated by reference as if fully set forth.

FIELD

Examples relate to concepts for protecting against effects of electrostatic discharge (ESD) on a pressure sensor device and applications thereof and in particular to pressure sensor devices and methods for manufacturing pressure sensor devices.

BACKGROUND

Pressure sensors have a pressure port, an opening in the package through which pressure can be measured on the sensing element of the pressure sensor. The pressure port enables the sensor to measure air pressure in e.g. the door cavity of a car. An air volume is directly exposed to the sensor surface.

Because of the pressure port in the first (and second) level packages, this type of sensor is particularly susceptible to such type of air discharge during an ESD (test). Within the air filling of the pressure port, high electrical fields are present during an ESD (test). These are able to cause gas discharges (corona) within this air filling causing secondary effects like creation of free charges (ions and electrons) in the air filling, drift of free charges within a totally isolated system, very sharp and unpredictable electrical field transients within the air filling, and charging of the inner cavity walls and the sensor surface, with an uncontrolled charge distribution.

It may be desired to obtain better ESD protection for pressure sensor devices.

SUMMARY

There may be a demand to provide concepts for pressure sensor devices, which allow improving the ESD robustness.

Such a demand may be satisfied by the subject matter of the claims.

Some embodiments relate to a pressure sensor device including a semiconductor die of the pressure sensor device and a bond wire of the pressure sensor device. A maximal vertical distance between a part of the bond wire and the semiconductor die is larger than a minimal vertical distance between the semiconductor die and a surface of a gel covering the semiconductor die.

Some embodiments relate to a pressure sensor device. The pressure sensor device includes a semiconductor die of the pressure sensor device. The pressure sensor device includes a bond wire of the pressure sensor device. At least a crossing portion of the bond wire extends over the semiconductor die. A length of the crossing portion is longer than half of a dimension of the semiconductor die.

Some embodiments relate to a pressure sensor device. The pressure sensor device includes a semiconductor die of the pressure sensor device. The pressure sensor device includes a bond wire of the pressure sensor device. A first end of the bond wire is bonded to a bond pad of the semiconductor die. A second end of the bond wire is an open end.

Some embodiments relate to a method for manufacturing a pressure sensor device. The method includes providing a semiconductor die of the pressure sensor device. The method includes forming a bond wire of the pressure sensor device. At least a crossing portion of the bond wire extends over the semiconductor die. A length of the crossing portion is longer than half of a dimension of the semiconductor die.

Some embodiments relate to a method for manufacturing a pressure sensor device. The method includes providing a semiconductor die of the pressure sensor device. The method includes forming a bond wire of the pressure sensor device. A first end of the bond wire is bonded to a bond pad of the semiconductor die and a second end of the bond wire is an open end.

BRIEF DESCRIPTION OF THE DRAWINGS

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
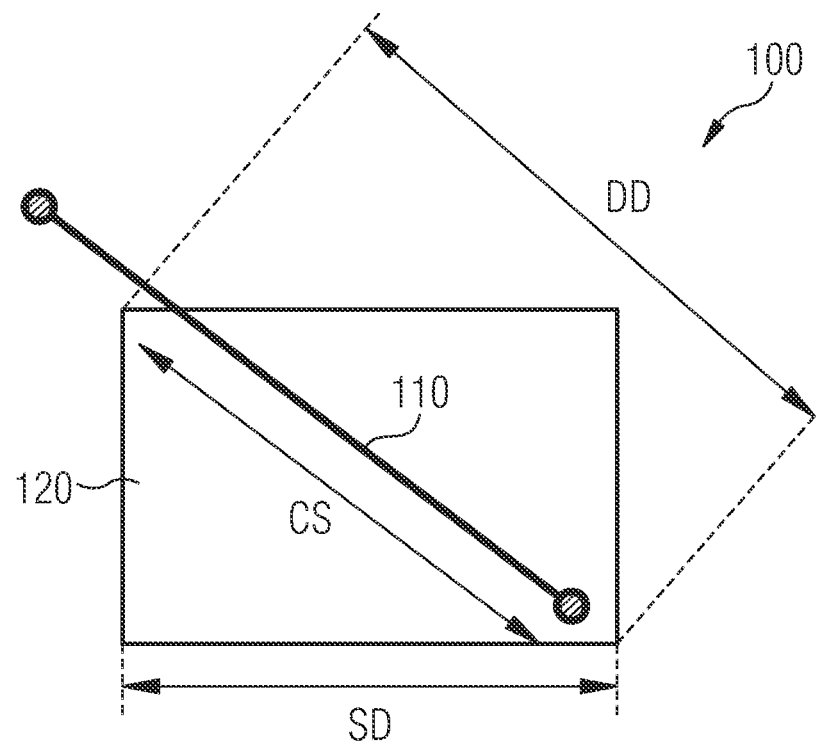
FIG. 1 shows a schematic illustration of a top side of a pressure sensor device comprising a bond wire with a crossing portion over the semiconductor die.

FIG. 1 shows a schematic illustration of a top side of a pressure sensor device 100 according to an embodiment. The pressure sensor device 100 comprises a semiconductor die 120 of the pressure sensor device 100. The pressure sensor device 100 comprises a bond wire 110 of the pressure sensor device 100. At least a crossing portion CS of the bond wire 110 extends over the semiconductor die 120. A length of the crossing portion CS is longer than half (or larger than 70%) of a dimension SD of the semiconductor die 120.

Due to the crossing portion CS over the semiconductor die 110, electrical charge can be lead along the bond wire. This may reduce or avoid electric discharging through undesired parts of the semiconductor die. In this way, the ESD robustness of the semiconductor die 110 may be improved.

For example, the crossing portion CP of the (first) bond wire 110 is a portion of the bond wire, which lies in the area of the semiconductor die 120 in a top view of the semiconductor die 120. For example, the crossing portion CP of the bond wire 110 is a portion of the bond wire, which overlaps the area of the semiconductor die 120. For example, the crossing portion CP of the bond wire 110 is a portion of the bond wire located above the semiconductor die 110 within a region laterally limited by the edges of the semiconductor die 120 (e.g. within a cuboid comprising side walls starting at the edges of the semiconductor die and extending vertically). For example, if a bond wire extends from outside a lateral area of the semiconductor die to a bond pad of the semiconductor die, the crossing portion CP of the bond wire 110 is the portion of the bond wire 110, which extends from the bond pad of the semiconductor die 120 to a point vertically above an edge of the semiconductor die 120.

The dimension SD of the semiconductor die 120 may be the length of an edge or the longest edge of the semiconductor die 120. For example, the semiconductor die 120 may comprise a rectangular shape and the dimension SD of the semiconductor die 120 may be the length of the longer side (or the shorter side) of the rectangle.

For example, the length of the crossing portion CS is larger than the dimension SD of the semiconductor die 120. The dimension SD may be a lateral length. The dimension SD may be a length or a width of the semiconductor die.

For example, the length of the crossing portion CS is equal or less than a diagonal dimension DD of the semiconductor die 120. The crossing portion CS may be larger than the dimension SD of the semiconductor die 120. The crossing portion CS may be smaller than the diagonal dimension DD of the semiconductor die 120.

Due to the length of the crossing portion CS, electrical charges may be kept away from the semiconductor die 120.

For example, the bond pad is a reference voltage pad (e.g. ground pad) to enable a connection to a reference voltage (e.g. ground). The semiconductor die 120 can comprise one or more bond pads being ground pads. The pressure sensor device 100 can comprise one or more bond wires 110 for improving the ESD robustness. The one or more bond wires 110 can be connected to a respective ground pad or some bond wires could be connected to a same ground pad.

For example, a maximal vertical distance between the bond wire 110 and the semiconductor die 120 is larger than 50 μm (or larger than 100 μm or larger than 200 μm) and/or less than 1 mm (or less than 700 μm or less than 500 μm). For example, the bond wire 110 has a diameter larger than 10 µm (or larger than 30 µm or larger than 80 µm) and less than 300 µm (or less than 100 µm or less than 70 µm).

For example, the semiconductor die 120 comprises a bond pad, wherein an end of the bond wire 110 is bonded to the bond pad of the semiconductor die 120.

For example, the semiconductor die 120 comprises another (second) bond pad, wherein the bond wire 110 ends on the other bond pad. In this example, the whole bond wire 100 extends over the semiconductor die so that the crossing portion CP of the bond wire is the whole bond wire 110. The (first) bond pad of the semiconductor die 120 and the other (second) bond pad of the semiconductor die 120 may be arranged at least half of the dimension of the semiconductor die 120 apart at opposite edges of the semiconductor die. The first bond pad of the semiconductor die 120 may be spaced apart from the second bond pad by at least half of the dimension SD of the semiconductor die 120. The first bond pad of the semiconductor die 120 may be less than a diagonal dimension DD of the semiconductor die 120 spaced apart from the second bond pad. The first and second bond pads may be arranged at edges of the semiconductor die 120. The first and second bond pads may be arranged at corners of the semiconductor die 120.

For example, the pressure sensor device 100 comprises a package structure (e.g. comprising a lead frame or a package carrier substrate). The package structure may comprise a bond pad and an end of the bond wire 110 may be bonded to the bond pad of the package structure. For example, the bond wire 110 starts on a bond pad of the semiconductor die 120 and ends on the bond pad of the package structure.

For example, an intermediate contact portion of the bond wire 110 may be bonded on a further bond pad of the semiconductor die 120. The distance between the two bond pads on the semiconductor die 120 may be larger than the dimension SD of the semiconductor die 120. The distance between the two bond pads on the semiconductor die 120 may be smaller than the diagonal dimension DD of the semiconductor die 120. A distance between the bond pad of the semiconductor die 120 to the bond pad of the package structure may be larger than a distance between the further bond pad of the semiconductor die 120 and the bond pad of the package structure.

For example, at least a part of the crossing portion CS of the bond wire 110 is located between the bond pad of the semiconductor die 120 and the intermediate end of the bond wire 110 (the other bond pad).

For example, the bond pad of the semiconductor die is positioned at a far side of the semiconductor die 120 with respect to the bond pad of the package structure, such that the crossing portion CS of the bond wire 110 extends over at least half of the dimension of the semiconductor die 120.

For example, the crossing portion CS of the bond wire 110 extends over the semiconductor die 120 in a crosswise direction. For example, the crossing portion CS of the bond wire 110 extends over the semiconductor die 120 in parallel to a side of the semiconductor die. The crossing portion CS of the bond wire 110 may extend over a central area of the semiconductor die. The central area may be defined by an area around a center of the semiconductor die 120. The area around the center can be less than 50% (or less than 30% or less than 20%) of the dimension of the semiconductor die 120 squared.

For example, the semiconductor die 120 comprises a membrane structure. The membrane structure may be adapted to be deformed by a present gas pressure. The crossing portion CS of the bond wire 110 may extend across the membrane structure. The membrane structure may be arranged in a center of the semiconductor die. The membrane structure may be located at the central area of the semiconductor die. The membrane structure may form the central area.

For example, pressure sensor device 100 comprises the first bond wire 110 and a second bond wire. A first end A of the second bond wire may be bonded to a bond pad of the semiconductor die 120. A second end B of the second bond wire may be an open end (e.g. see FIG. 14). The first bond wire 110 of the pressure sensor device 100 and the second bond wire may be bonded to the same bond pad or different bond pads of the semiconductor die 120. The first bond wire 110 and the second bond wire may be located at least half of a dimension SD of the semiconductor die 120 apart. The first bond wire 110 and the second bond wire may be less than a diagonal dimension DD of the semiconductor die 120 apart. The first bond wire 110 and/or the second bond wire may be arranged on bond pads at respective edges of the semiconductor die 120. The first bond wire 110 and/or the second bond wire may be arranged on bond pads at respective corners of the semiconductor die 120.

For example, the pressure sensor device 100 comprises further bond wires. The further bond wires may be arranged and adapted to connect bond pads (e.g. input and/or output bond pads and/or voltage supply pads) of the semiconductor die 120 with bond pads of the package structure.

For example, the pressure sensor device comprises a further bond wire 110 bonded to a bond pad of the package structure and having an open end.

For example, the pressure sensor device 100 comprises a gel. At least a part of the semiconductor die 120 or the whole semiconductor die 120 may be covered by the gel. The gel may be a viscoelastic material (e.g. polydimethylsiloxan). The gel may have a viscosity of smaller than 10 Pa*s. The gel may have a viscosity of larger than 10 mPa*s. The gel may have a viscosity of larger than 100 mPa*s. The gel may have a viscosity of larger than 1 Pa*s.

Figure 5:
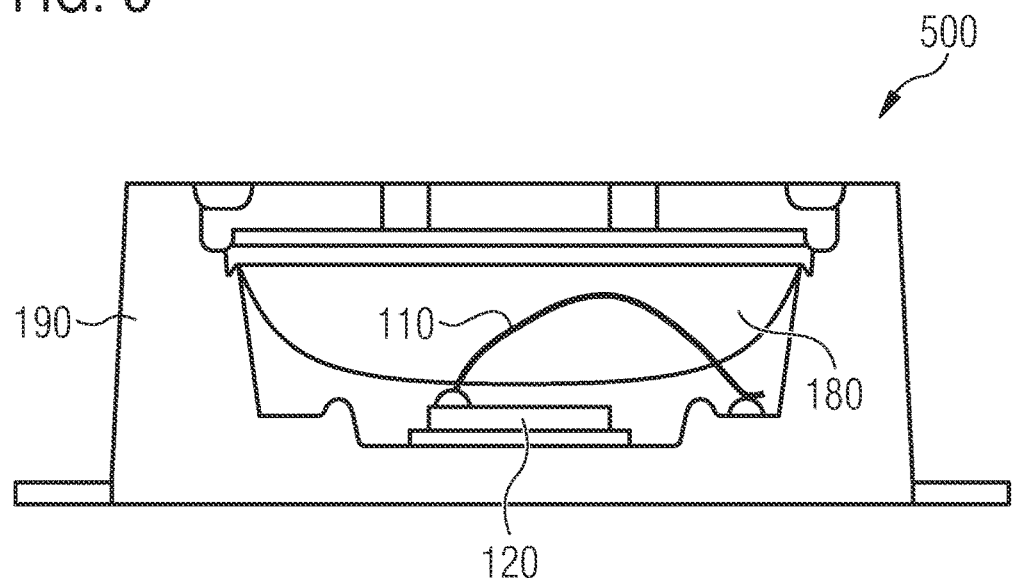
FIG. 5 shows a schematic illustration of a cross section of a pressure sensor device with one end of a bond wire on a package structure and the other end of the bond wire on a semiconductor die.

The bond wire 110 may run at least partly through the gel (e.g. see FIG. 5). For example, the crossing portion is outside or inside the gel.

For example, the bond wire 110 is covered by the gel. The bond wire 110 may be completely covered by the gel. A minimal distance between the bond wire 110 and a surface of the gel may be less than 10 µm (or less than 5 µm or less than 1 µm).

For example, the pressure sensor device 100 comprises a cavity. The cavity may comprise a maximal vertical extension of more than 100 µm (or more than 300 µm or more than 500 µm or more than 1 mm) and/or less than 5 mm (or less than 2 mm or less than 1 mm) and/or a lateral extension larger than a dimension of the semiconductor die 120. For example, the cavity is located adjacent to the gel. At least a part of the crossing portion CS of the bond wire 110 is located within the cavity. For example, at least a part of the crossing portion CS of the bond wire 110 is located outside the gel.

For example, a minimal thickness of the gel above the semiconductor die 120 is smaller than a maximal distance between the bond wire 110 and a surface of the gel. In this way, an electrical discharge may hit the bond wire far before reaching the gel or the semiconductor die 120.

For example, a ratio between a length of all portions of the bond wire (110) located outside of the gel and a length of all portions of the bond wire (110) located inside the gel is larger than 2:1 (or larger than 3:1, larger than 4:1, larger than 5:1, larger than 6:1, or larger than 7:1).

For example, the semiconductor die 120 is a microelectromechanical system, MEMS.

The semiconductor die may comprise a semiconductor substrate and a wiring layer stack located on the semiconductor substrate. The semiconductor die may comprise a silicon substrate, for example. Alternatively, the semiconductor substrate may be a wide band gap semiconductor substrate having a band gap larger than the band gap of silicon (1.1 eV). For example, the semiconductor substrate may be a silicon carbide (SiC)-based semiconductor substrate, or gallium arsenide (GaAs)-based semiconductor substrate, or a gallium nitride (GaN)-based semiconductor substrate.

For example, the vertical direction and a vertical dimension or thicknesses of layers may be measured orthogonal to a front side surface of the semiconductor die or the semiconductor substrate of the semiconductor die and a lateral direction and lateral dimensions may be measured in parallel to the front side surface of the semiconductor die or the semiconductor substrate of the semiconductor die.

The front side (or front side surface) of the semiconductor die or semiconductor substrate may be the side (or surface) used to implement more sophisticated and complex structures (e.g. the membrane of the pressure sensor device may be implemented at the front side) than at the back side of the semiconductor die or semiconductor substrate, since the process parameters (e.g. temperature) and the handling may be limited for the back side, if structures are already formed at one side of the semiconductor die or semiconductor substrate, for example.

Figure 2:
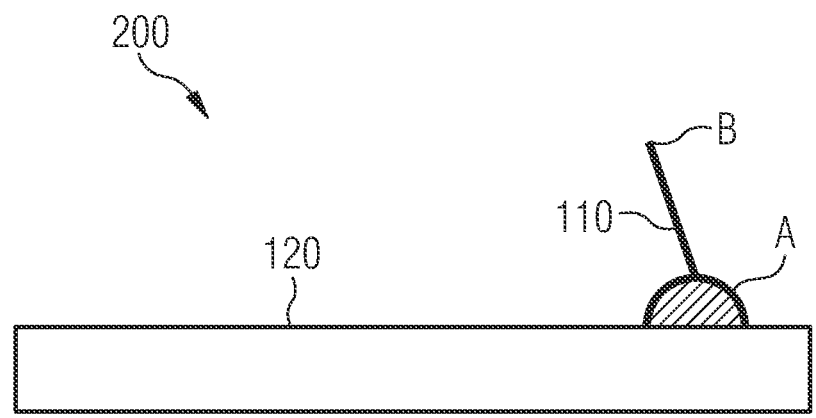
FIG. 2 shows a schematic illustration of a cross section of pressure sensor device comprising a bond wire with an open end.

FIG. 2 shows a schematic illustration of a cross section of a pressure sensor device 200 according to an embodiment. The pressure sensor device 200 comprises a semiconductor die 120 of the pressure sensor device 200. The pressure sensor device 200 comprises a bond wire 110 of the pressure sensor device 200. A first end A of the bond wire 110 is bonded to a bond pad of the semiconductor die 120. A second end B of the bond wire 110 is an open end.

For example, the bond wire with the open end may work like a lightning rod, if an ESD event occurs. The ESD charge may be at least partly dissipated through the bond wire. In this way, the ESD robustness of the pressure sensor device 200 may be improved.

The bond wire 110 has an open end so that the bond wire 110 is bonded to a pad only with one end, for example. An open end may be an end of the bond wire, which is not bonded to a pad. The open end of the bond wire 110 may be located in a cavity above the semiconductor die 120 or in a gel covering at least a part of the semiconductor die 120, for example. The bond wire 110 may be in the form of a stud bump.

The bond pad may be a ground pad of the semiconductor die 120. The pressure sensor device 200 may comprise a package structure. The package structure may comprise a lead frame. The lead frame may comprise one or more ground pads. The one or more ground pads may be electrically connected to the ground bond pad of the semiconductor die 120.

For example, a length of the bond wire 110 of the pressure sensor device 200 is less than 1 mm (or less than 700 µm) and longer than 200 µm (or longer than 500 µm).

For example, the bond wire 110 of the pressure sensor device 200 has a maximal inclination of 40 degrees. The maximal inclination may be defined by an angle between a direction of the bond wire 110 and a normal direction with respect to a front side of the semiconductor die 120.

For example, the bond wire is a first bond wire 110. For example, the pressure sensor device 200 comprises a second bond wire. A first end A of the second bond wire may be bonded to a bond pad of the semiconductor die 120. A second end B of the second bond wire may be an open end. The first bond wire 110 of the pressure sensor device 200 and the second bond wire may be arranged on different bond pads of the semiconductor die 120. The first bond wire 110 and the second bond wire may be located at least half of a dimension SD of the semiconductor die 120 apart. The first bond wire 110 and the second bond wire may be located at least a dimension SD of the semiconductor die 120 apart. The first bond wire 110 and the second bond wire may be located less than a diagonal dimension DD of the semiconductor die 120 apart.

For example, the pressure sensor device 200 comprises another bond wire. The other bond wire may vertically extend from the package structure and has an open end. The pressure sensor device 200 may comprise more other bond wires. The other bond wires may be arranged around the semiconductor die 120. The other bond wires can each be arranged near edges of the semiconductor die 120 on the package structure.

For example, the pressure sensor device 200 comprises a gel. At least a part of the semiconductor die 120 may be covered by the gel. The bond wire 110 may run at least partly through the gel. For example, the bond wire 110 runs at least half of a length of the bond wire 110 outside the gel. For example, the bond wire 110 may be at least partly covered by the gel.

For example, the bond wire 110 may be completely covered by the gel. For example, a minimal distance from the bond wire 110 to a surface of the gel is less than 10 µm.

For example, a cavity may be located adjacent to the gel. At least a part of the bond wire 110 may extend in or into the cavity.

For example, a thickness of the gel may be smaller than a depth of the cavity.

More details and aspects are mentioned in connection with the embodiments described above or below. The embodiment shown in FIG. 2 may comprise one or more optional additional features corresponding to one or more aspects mentioned in connection with the proposed concept or one or more embodiments described above (e.g. FIG. 1) or below (e.g. FIGS. 3-25).

Figure 3:
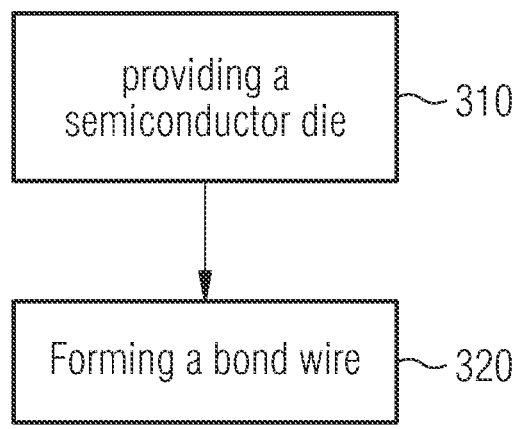
FIG. 3 shows a flow chart of a method for manufacturing a pressure sensor device.

FIG. 3 shows a flow chart of a method for manufacturing a pressure sensor device according to an embodiment. The method comprises providing 310 a semiconductor die of the pressure sensor device. The method comprises forming 320 a bond wire of the pressure sensor device. At least a crossing portion CS of the bond wire extends over the semiconductor die. A length of the crossing portion CS is longer than half of a dimension SD of the semiconductor die.

The method may further comprise attaching the semiconductor die to a package structure. The package structure may comprise a lead frame. For example, a bond wire may be bonded from a ground pad of the package structure to another ground pad of the package structure or to a ground pad of the semiconductor die 120.

The method may further comprise forming a gel to cover at least a part of the semiconductor die.

More details and aspects are mentioned in connection with the embodiments described above or below. The embodiment shown in FIG. 3 may comprise one or more optional additional features corresponding to one or more aspects mentioned in connection with the proposed concept or one or more embodiments described above (e.g. FIGS. 1-2) or below (e.g. FIGS. 4-25).

Figure 4:
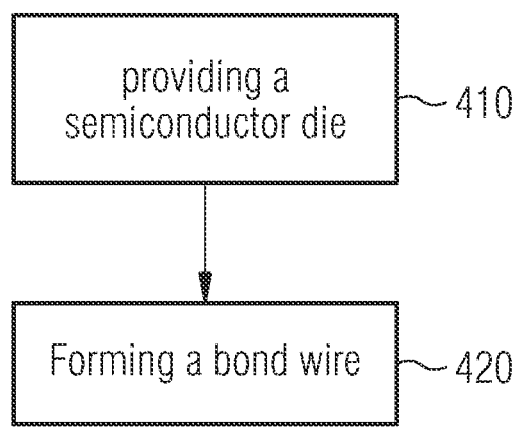
FIG. 4 shows a flow chart of a method for manufacturing a pressure sensor device and forming a bond wire.

FIG. 4 shows a flow chart of a method for manufacturing a pressure sensor device and forming a bond wire according to an embodiment. The method comprises providing 410 a semiconductor die 120 of the pressure sensor device. The method comprises forming 420 a bond wire of the pressure sensor device. A first end A of the bond wire is bonded to a bond pad of the semiconductor die. A second end B of the bond wire is an open end.

More details and aspects are mentioned in connection with the embodiments described above or below. The embodiment shown in FIG. 4 may comprise one or more optional additional features corresponding to one or more aspects mentioned in connection with the proposed concept or one or more embodiments described above (e.g. FIGS. 1-3) or below (e.g. FIGS. 5-25).

FIG. 5 shows a schematic illustration of a cross section of a pressure sensor device 500 with one end of a bond wire 110 on a package structure 190 and the other end of the bond wire 110 on a semiconductor die 120 according to an embodiment. The bond-wire (can be of the same type that is used in connecting the Silicon die to the bond pads of the package structure) is routed above and across the (MEMS) sensor (semiconductor die 120). The cross-bond wire may act as both as an electrical shield and as a lightning pole, and also as a mechanical stabilizing anchor. FIG. 5 further shows a package structure 190. In FIG. 5 the bond wire 110 is connected to merely two bond pads. One of the two bond pads is a ground pad of the package structure 190. The other one of the two bond pads is a ground pad of the semiconductor die 120. In FIG. 5, the bond wire 110 crosses a cavity 180. A length of the bond wire 110 crossing the cavity 180 is at least twice as long as a length not crossing the cavity 180. The bond wire 110 is connected from the package structure 190 to the semiconductor die 120 in such a way, that the bond wire crosses at least a dimension SD of the semiconductor die 120 from the package structure 190 to the ground pad of the semiconductor die 120. The ground pad of the semiconductor die 120 lies at a far edge with respect to the ground pad of the package structure 190. The bond wire 110 crossing at least a part of the semiconductor die 120 may also be referred to as cross-bond wire.

For example, FIG. 5 shows cross bonding from chip to lead. The cross-bond can be bonded on the chip side on the main ground pad or an additional pad can be added to reduce radiated immunity susceptibility.

More details and aspects are mentioned in connection with the embodiments described above or below. The embodiment shown in FIG. 5 may comprise one or more optional additional features corresponding to one or more aspects mentioned in connection with the proposed concept or one or more embodiments described above (e.g. FIGS. 1-4) or below (e.g. FIGS. 6-25).

Figure 6:
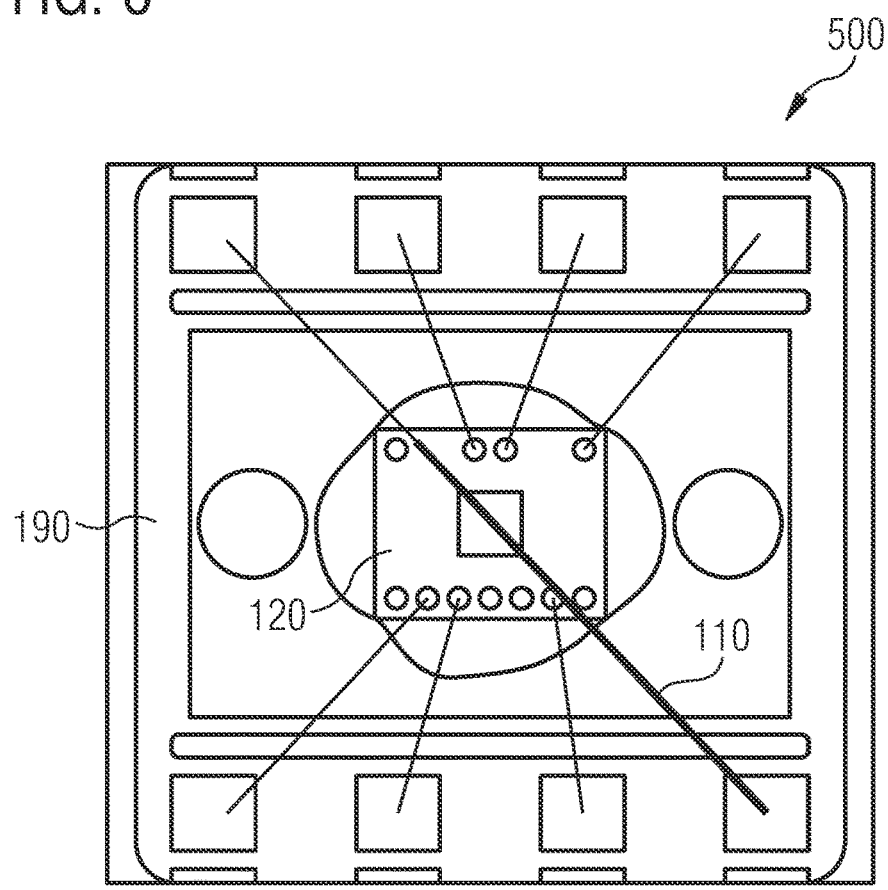
FIG. 6 shows a schematic top view of a top side of the pressure sensor device of FIG. 5.

FIG. 6 shows a schematic top view of a top side of the pressure sensor device of FIG. 5. The bond wire extends from one edge of the package structure 190 to an opposite edge of the semiconductor die 120, such that the bond wire 110 crosses at least a dimension SD of the semiconductor die 120.

Figure 7:
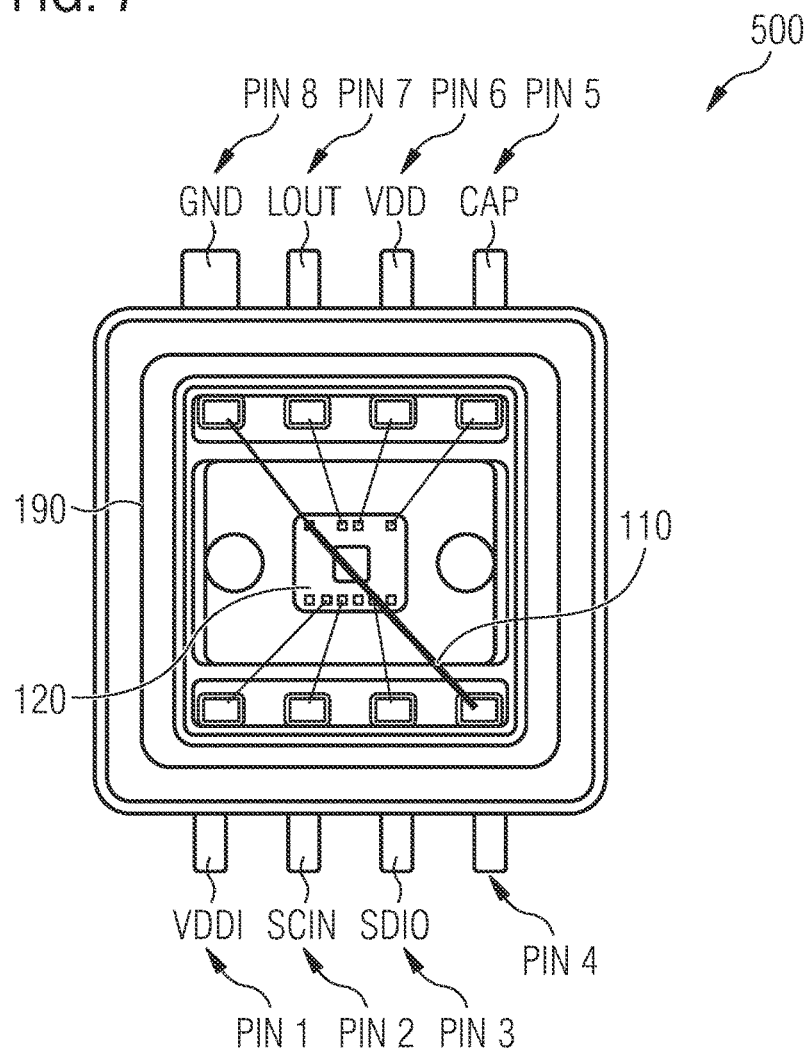
FIG. 7 shows another schematic top view of a top side of the pressure sensor device of FIG. 5.

FIG. 7 shows another schematic top view of the pressure sensor device of FIG. 5. Further to FIG. 6, a package outline is shown.

The cross-bond wire 110 is routed over the sensor area. The direction of the bond wire 110 in the xy plane may be diagonal on the (MEMS) semiconductor die 120 or parallel with a side, for example. The z-axis distance between the bond wire 110 and the MEMS semiconductor die 120 is adjustable. The inclusion of the wire within the gel or outside the gel is adjustable. For example, a start-end point may be on the leadframe, or may start on the leadframe and end on chip or chip to chip or studbump-wire (one end bonded, the other end free).

FIG. 7 schematically illustrates cross bonding from chip to lead. The cross-bond wire 110 can be bonded on the chip side on a main ground pad or an additional pad can be added.

Figure 8:
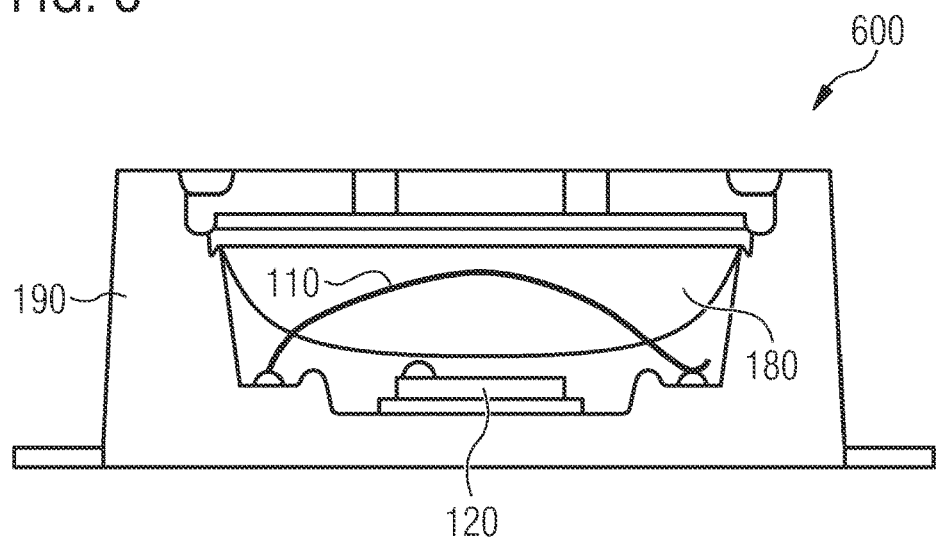
FIG. 8 shows a schematic illustration of a cross section of a pressure sensor device with one end of a bond wire on a package structure and the other end of the bond wire also on the package structure.

FIG. 8 shows a schematic illustration of a cross section of a pressure sensor device 600 with one end of a bond wire 110 on a package structure 190 and the other end of the bond wire 110 also on the package structure 190 according to an embodiment. The bond wire 110 extends over the semiconductor die 120. The bond wire 110 is merely connected between two ground pads on the package structure 190. The bond wire extends partly through the cavity 180. The cavity 180 covers/surrounds the bond wire 110 at least for 70% of a length of the bond wire. The bond wire is adapted to extend over a central area of the semiconductor die 120. Thus, electric charges can be kept away from discharging through a membrane of the semiconductor die 120.

For example, FIG. 8 shows cross bonding from lead to lead. The electrical effects (field decrease below the wire, Corona focus point) may be significantly improved in this configuration.

More details and aspects are mentioned in connection with the embodiments described above or below. The embodiment shown in FIG. 8 may comprise one or more optional additional features corresponding to one or more aspects mentioned in connection with the proposed concept or one or more embodiments described above (e.g. FIGS. 1-7) or below (e.g. FIGS. 9-25).

Figure 9:
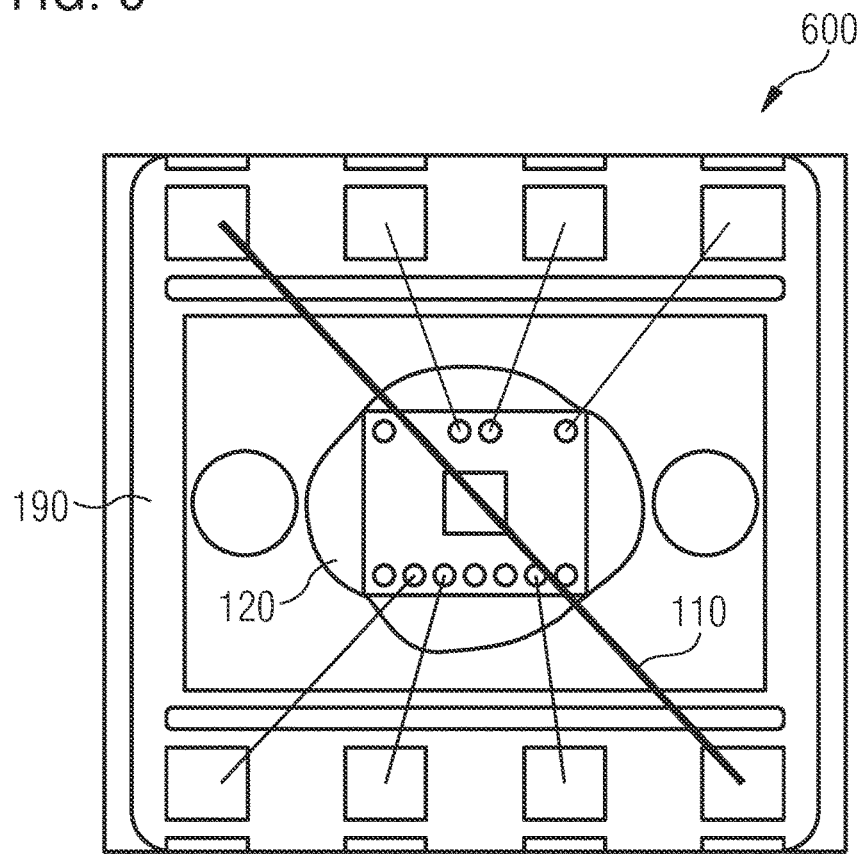
FIG. 9 shows a schematic top view of the pressure sensor device of FIG. 8.

FIG. 9 shows a schematic top view of the pressure sensor device 600 of FIG. 8. The bond wire 110 is merely connected to two opposite edges of the package structure 190, such that the bond wire extends in a diagonal direction over the semiconductor die 120.

Figure 10:
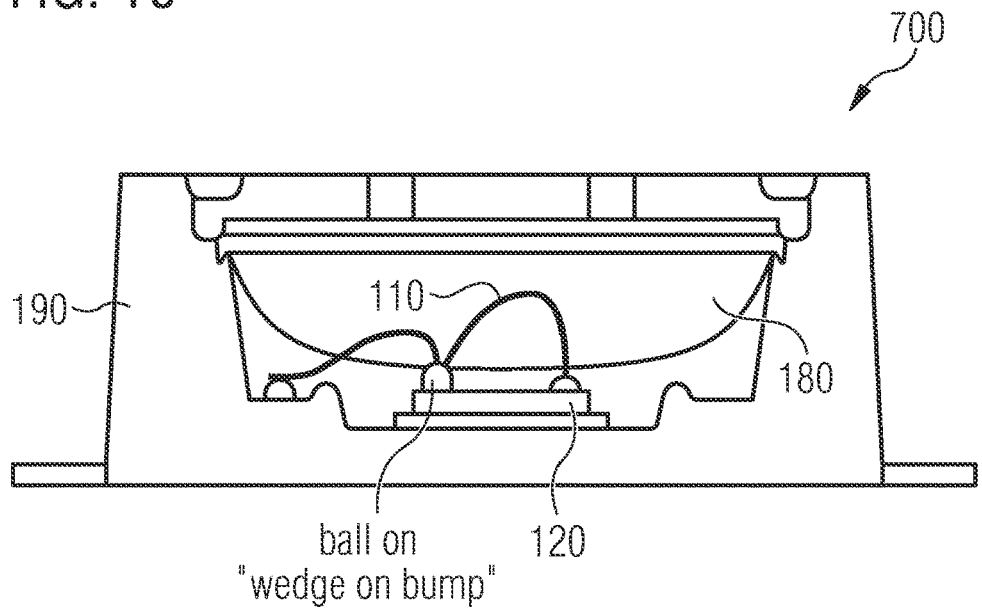
FIG. 10 shows a schematic illustration of a cross section of a pressure sensor device with a first end of a bond wire on a semiconductor device, an intermediate end of the bond wire on the semiconductor device and a second end of the bond wire on a package structure.

FIG. 10 shows a schematic illustration of a cross section of a pressure sensor device 700 with a first end of a bond wire 110 on a semiconductor device 120, an intermediate end of the bond wire 110 on the semiconductor device 120 and a second end of the bond wire 110 on a package structure 190 according to an embodiment. The bond wire 110 is provided by bonding from the first end of the bond wire 110 to the intermediate end of the bond wire 110 to the second end of the bond wire 110. The part of the bond wire 110 between the first end of the bond wire 110 and the intermediate end of the bond wire 110 extends through the cavity 180.

For example, FIG. 10 shows cross bonding on chip (pad to pad) and a ball on wedge on bump.

More details and aspects are mentioned in connection with the embodiments described above or below. The embodiment shown in FIG. 10 may comprise one or more optional additional features corresponding to one or more aspects mentioned in connection with the proposed concept or one or more embodiments described above (e.g. FIGS. 1-9) or below (e.g. FIGS. 11-25).

Figure 11:
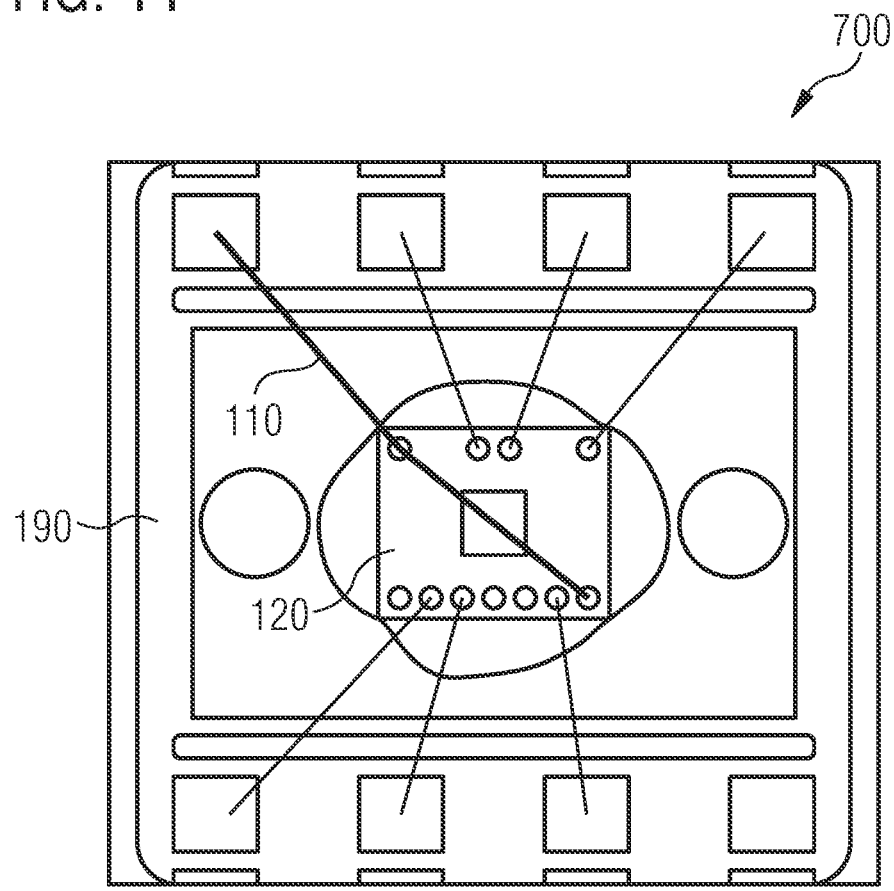
FIG. 11 shows a schematic illustration of a top view of the pressure sensor device of FIG. 10.

FIG. 11 shows a schematic illustration of a top view of the pressure sensor device of FIG. 10. The part of the bond wire 110 between the first end of the bond wire 110 and the intermediate end of the bond wire 110 is at least larger than a dimension SD of the semiconductor die 120. The part of the bond wire 110 between the first end of the bond wire 110 and the intermediate end of the bond wire 110 is less than a diagonal dimension DD of the semiconductor die 120. The intermediate end of the bond wire 110 is located at a near edge/corner with respect to the second end of the bond wire 110. The bond wire 110 is bonded in crosswise direction from an outer bond pad (first end) of the semiconductor die 120 to an outer bond pad (second end) of the package structure 190.

Figure 12:
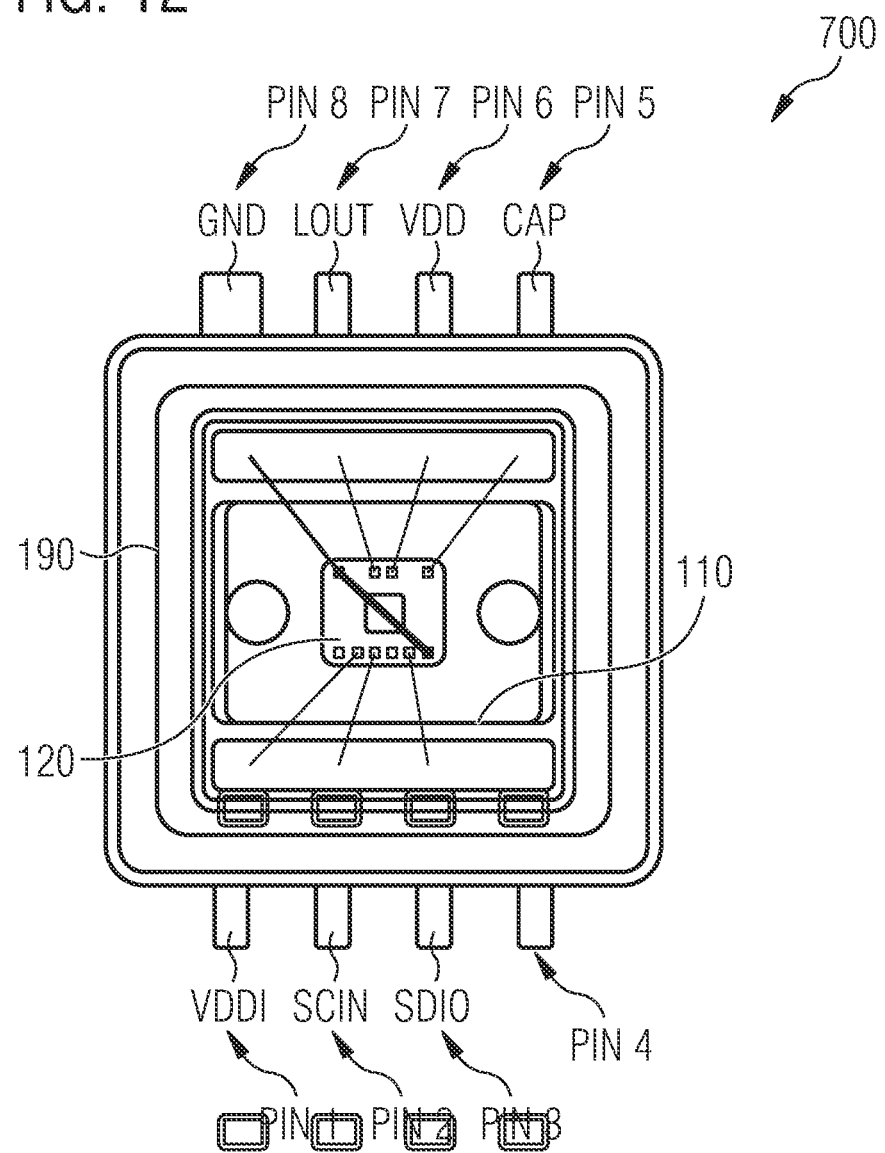
FIG. 12 shows another schematic illustration of a top view of the pressure sensor device of FIG. 10.

FIG. 12 shows another schematic illustration of a top view of the pressure sensor device of FIG. 10

Figure 13:
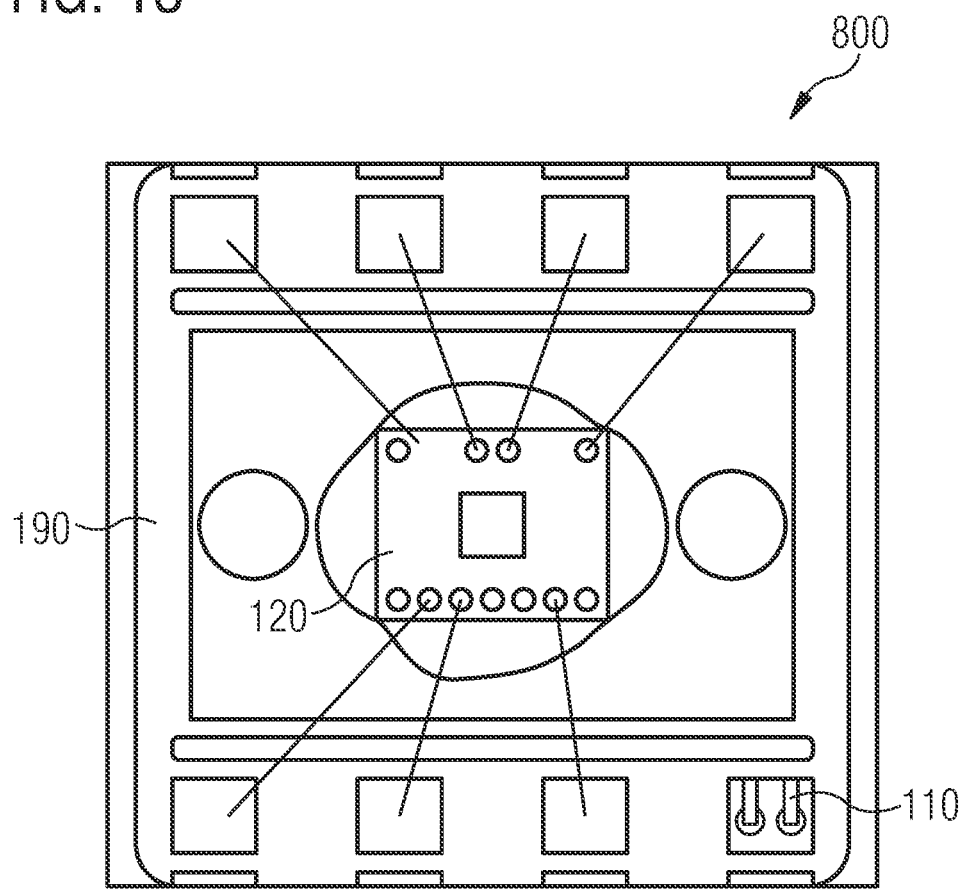
FIG. 13 shows a schematic illustration of a top view of a pressure sensor device with bond wires placed at a ground pad of a package structure on one side and open end on the second side.

FIG. 13 shows a schematic illustration of a top view of a pressure sensor device 800 with bond wires 110 placed at a ground pad of a package structure 190 according to an embodiment. The bond wires 110 are in the form of stud bumps. Two stud bumps are placed on a ground pad, which is farthest away from the semiconductor die 120.

More details and aspects are mentioned in connection with the embodiments described above or below. The embodiment shown in FIG. 13 may comprise one or more optional additional features corresponding to one or more aspects mentioned in connection with the proposed concept or one or more embodiments described above (e.g. FIGS. 1-12) or below (e.g. FIGS. 14-25).

Figure 14:
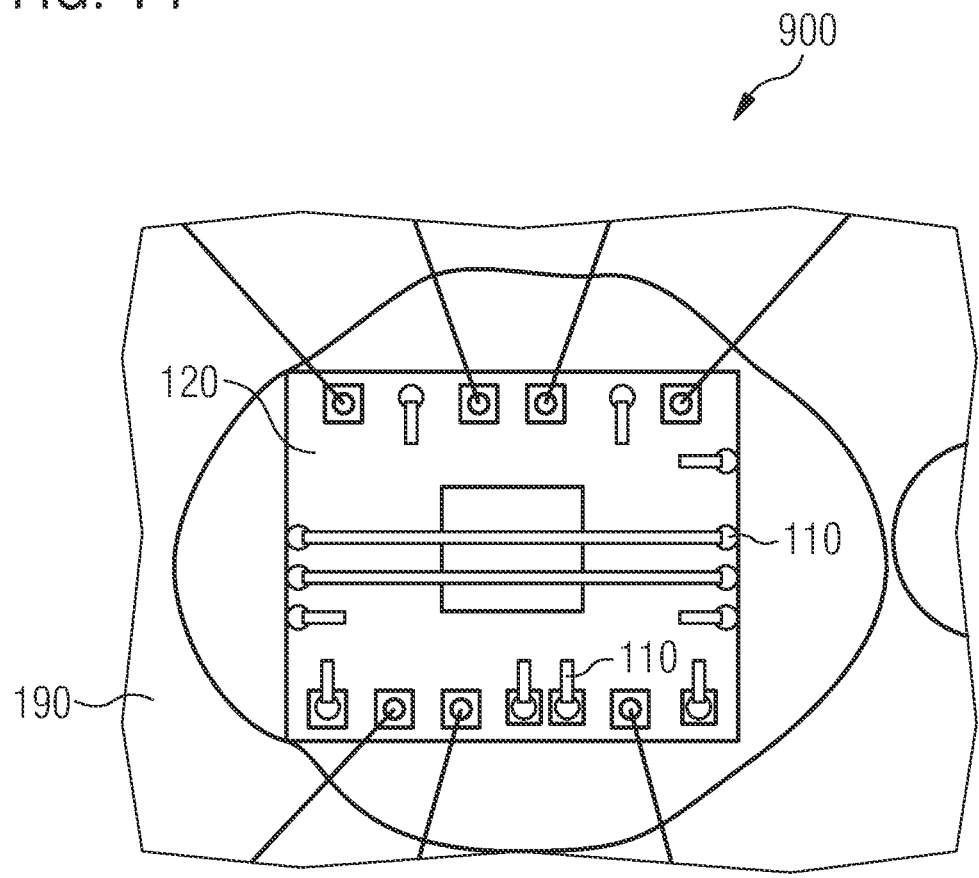
FIG. 14 shows a schematic illustration of a top view of a pressure sensor device with bond wires extending from edges of a semiconductor die to respective other edges of the semiconductor die.

FIG. 14 shows a schematic illustration of a top view of a pressure sensor device 900 with bond wires 110 extending from edges of a semiconductor die 120 to respective other edges of the semiconductor die 120 according to an embodiment. Two bond wires 110 are shown extending parallel to an edge of the semiconductor die 120 from one edge to another. Further, bond wires 110 are shown in the form of stud bumps. The stud bumps are equally distributed on respective (remaining, leftover) ground pads of the semiconductor die 120.

More details and aspects are mentioned in connection with the embodiments described above or below. The embodiment shown in FIG. 14 may comprise one or more optional additional features corresponding to one or more aspects mentioned in connection with the proposed concept or one or more embodiments described above (e.g. FIGS. 1-13) or below (e.g. FIGS. 15-25).

Figure 15:
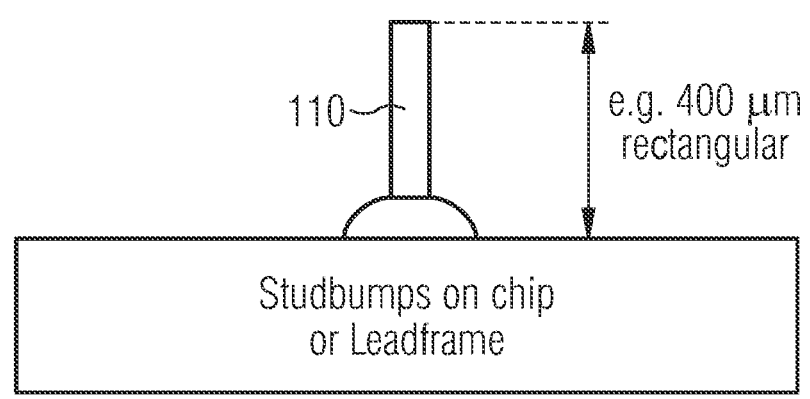
FIG. 15 shows a schematic illustration of a bond wire in stud bump form.

FIG. 15 shows a schematic illustration of a bond wire 110 in stud bump form. The stud bump can have a length/height of less than 400 μm.

More details and aspects are mentioned in connection with the embodiments described above or below. The embodiment shown in FIG. 15 may comprise one or more optional additional features corresponding to one or more aspects mentioned in connection with the proposed concept or one or more embodiments described above (e.g. FIGS. 1-14) or below (e.g. FIGS. 16-25).

Figure 16:
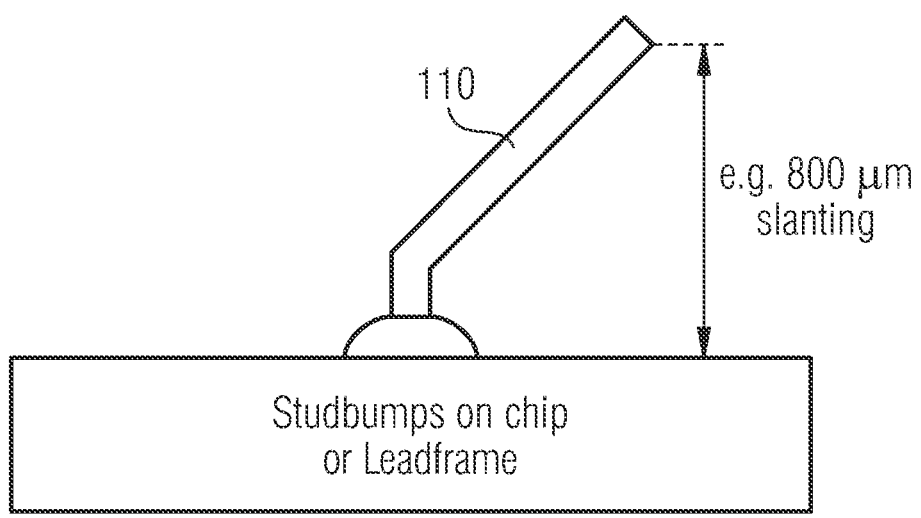
FIG. 16 shows a schematic illustration of a bond wire in stud bump form having an inclination.

FIG. 16 shows a schematic illustration of a bond wire 110 in stud bump form having an inclination. The stud bump can be slanted/inclined. A height of the stud bump can be less than 800 μm.

More details and aspects are mentioned in connection with the embodiments described above or below. The embodiment shown in FIG. 16 may comprise one or more optional additional features corresponding to one or more aspects mentioned in connection with the proposed concept or one or more embodiments described above (e.g. FIGS. 1-15) or below (e.g. FIGS. 17-25).

Figure 17:
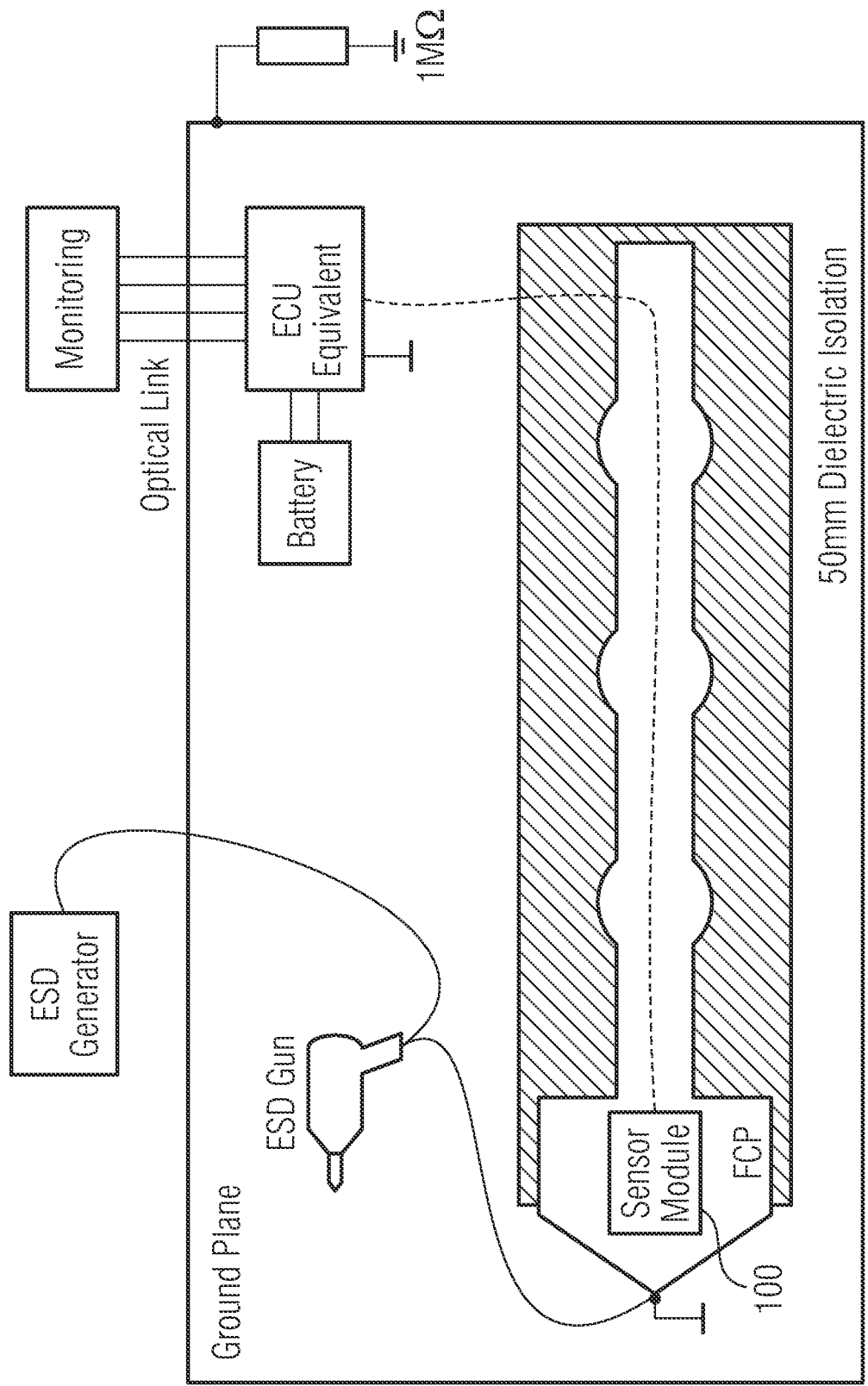
FIG. 17 shows a schematic illustration of an electrostatic discharge test on automotive pressure sensors.

FIG. 17 shows a schematic illustration of an electrostatic discharge test on automotive pressure sensors. FIG. 17 also shows a sensor module 100 (pressure sensor device 100 according to the foregoing figures), an ESD Gun, an ESD Generator, a Ground Plane, an ECU (electronic control unit) Equivalent, a Battery, a Monitoring system. The ESD Gun is driven by the ESD Generator generating a pulse for testing ESD capabilities. The ECU is powered by a battery and has a monitoring system connected via an optical link. The ground plane is connected to ground via a 1 MOhm impedance. A field coupling plane is isolated from the ground plane via a 50 mm dielectric isolation.

For example, the proposed concept may be used for Automotive Pressure Sensors. The automotive pressure sensors shall keep their full functionality during direct powered ESD air discharge tests (e.g. side-airbag door-satellite sensors).

One of the problems during the ESD air discharge test is that the pressure sensor readout is corrupted, which may cause a specification violation.

More details and aspects are mentioned in connection with the embodiments described above or below. The embodiment shown in FIG. 17 may comprise one or more optional additional features corresponding to one or more aspects mentioned in connection with the proposed concept or one or more embodiments described above (e.g. FIGS. 1-16) or below (e.g. FIGS. 18-25).

Figure 18:
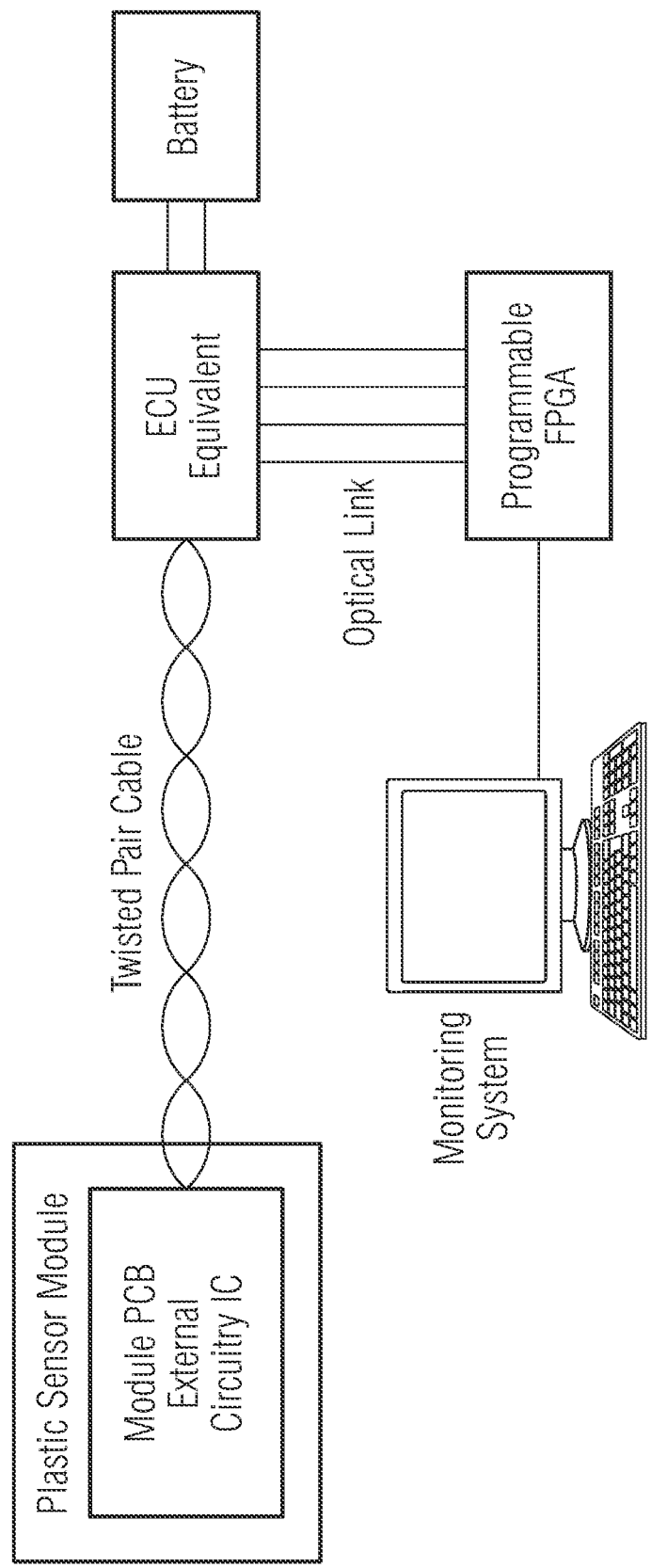
FIG. 18 shows a schematic illustration of a test system overview of a discharge test on automotive pressure sensors.

FIG. 18 shows a schematic illustration of a test system overview of a discharge test on automotive pressure sensors. The test system comprises a monitoring system, a programmable FPGA, an ECU Equivalent, a Battery, a twisted pair cable and a plastic sensor module with the sensor IC and optionally external circuitry on a PCB. The plastic sensor module is connected to the ECU Equivalent via the twisted pair cable. The ECU Equivalent is powered by the battery and connected to the programmable FPGA via the optical link. The monitoring system is connected to the programmable FPGA.

More details and aspects are mentioned in connection with the embodiments described above or below. The embodiment shown in FIG. 18 may comprise one or more optional additional features corresponding to one or more aspects mentioned in connection with the proposed concept or one or more embodiments described above (e.g. FIGS. 1-17) or below (e.g. FIGS. 19-25).

Figure 19:
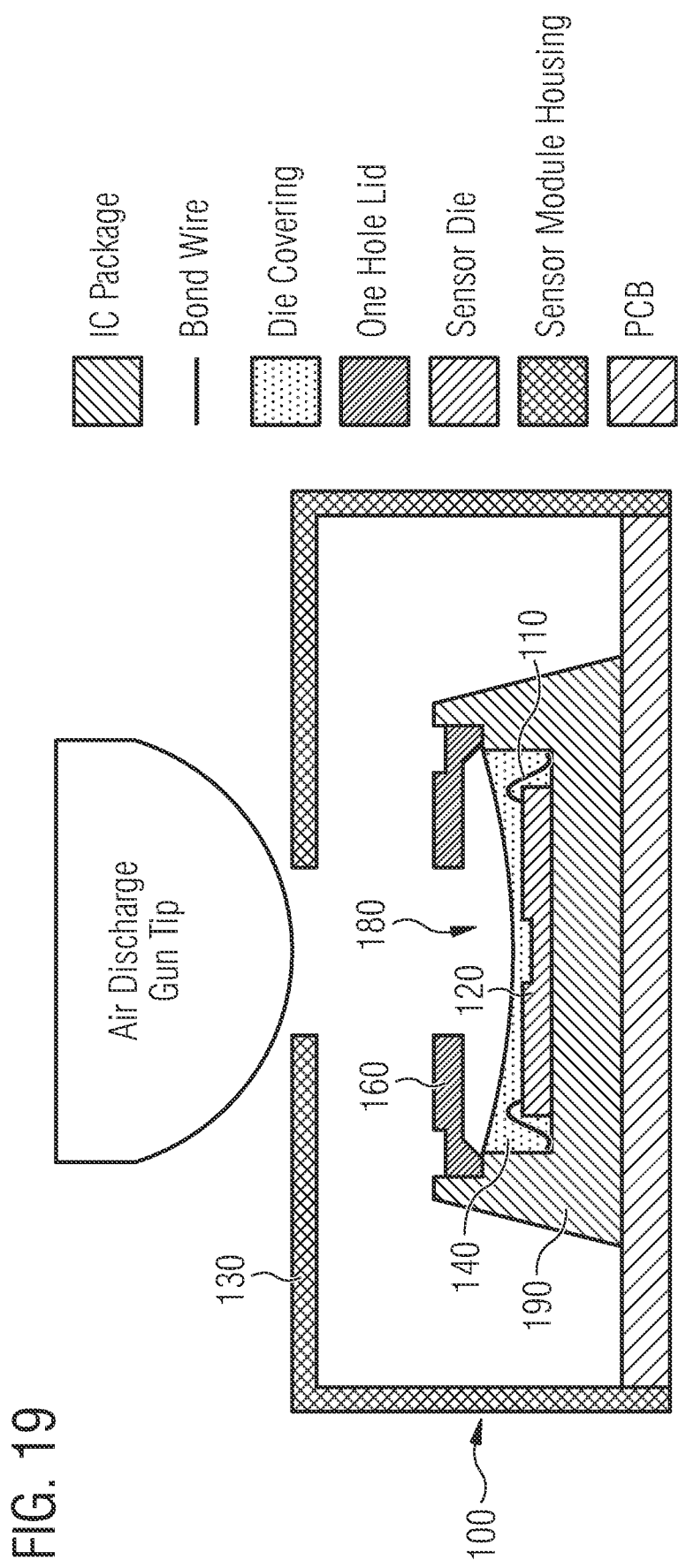
FIG. 19 shows a schematic illustration of a material stack in a pressure sensor module.

FIG. 19 shows a schematic illustration of a material stack in a pressure sensor module 100. FIG. 19 further shows an Air Discharge Gun Tip, an IC Package 190, a Sensor Module Housing 130, a One Hole Lid 160, a Sensor Die 120, a Die Cover (a gel) 140, a Bond Wire 110, a cavity 180 and PCB. The One Hole Lid 160 may also be omitted, such that the cavity just extends to a Open Lid 160.

As opposed to contact discharge ESD tests, in which electrostatic discharge is applied directly on conductive parts of the system under test, the air discharge ESD tests are performed by approaching a charged ESD gun (Air Discharge Gun Tip) towards specified isolated locations (e.g. Sensor Module Housing 130) in the system under test.

Because of the insulating properties of the gel 140 and cavity, the affected surfaces remain charged even after the gas discharges have ended.

There are two main classes of problems associated with the ESD air discharges in pressure sensors (depending on implementation, other sensors as well, e.g. gas).

The high electrical field intensity transients affect the pressure sensor MEMS readout. This is especially true for sensors with a capacitive pressure readout principle.

In automotive pressure sensors, the sensor is also covered with a gel mainly as a protection from particle contamination and to prevent corrosion of pads and bond wires by the moisture that could penetrate via the pressure port opening. The shape and position of the protective gel is also influenced during an ESD (test) due to the secondary effects of the gas discharges, causing a mechanical impact on the pressure sensor membrane. This translates into an unwanted pressure pulse at the output signal of the pressure sensor, independent of the sensing principle (capacitive, piezoresistive, etc.).

The test is conducted at second-level package. Protection methods can include proper second level package design with sufficient electrical isolation and distance between the ESD gun and the chip inside the (satellite) pressure sensor module 100. Methods can include Grounded Metal lids for the sensor IC 150 to shield the sensor 150 from the ESD electric field and ensuing effects (gas discharge).

More details and aspects are mentioned in connection with the embodiments described above or below. The embodiment shown in FIG. 19 may comprise one or more optional additional features corresponding to one or more aspects mentioned in connection with the proposed concept or one or more embodiments described above (e.g. FIGS. 1-18) or below.

Some embodiments relate to a Cross-Bond Wire as Protection Method against Powered ESD discharges.

According to an aspect, the electrical field below the crossing portion CS of the bond wire 110 may be decreased.

According to an aspect, the crosswise extending bond wire 110 may concentrate the electrical field at a single point, thus avoiding its impact and secondary effects on a gel covering.

According to an aspect, the crossing portion CS of the bond wire 110 may avoid the generated free charges to stick on a gel surface because they can be directly captured by the conducting crossing portion CS of the bond wire 110 during a gas discharge.

According to an aspect, the crossing portion CS of the bond wire 110 may mechanically stabilize the gel.

According to an aspect, the crossing portion CS of the bond wire 110 may reduce a movement of the gel.

According to an aspect, the crossing portion CS of the bond wire 110 may reduce the impulse on a MEMS membrane of the semiconductor die 120 under an influence of the ESD discharge.

According to an aspect, electrical effects (field decrease below the bond wire 110, Corona focus point) may be optimal to protect against an ESD.

According to an aspect, an ESD performance at a Tier1 level can be made independent on a Tier1 design.

According to an aspect, Powered ESD—susceptibility is reduced.

According to an aspect, bigger flexibility in module design (e.g. with a MEMS sensor oriented in the pressure sensor device 100 in other directions than towards an inner of a car door) may be achieved.

According to an aspect, cheaper manufacturing and testing cost are possible.

According to an aspect, ESD shielding and capturing of Corona-created charges by a grounded conductive cross-bond may be achieved. These measures are implemented either at a chip package level or at a die level (first-level package).

According to an aspect, gas discharge may be guided.

According to an aspect, pressure sensor device 100 with lower cost may be provided.

According to an aspect, flexibility may be provided at Tier1 and OEM level, because of no additional constraint in design of a pressure sensor.

Grounded Metal lids may be expensive. Thus, according to an aspect, a cheaper pressure sensor device 100 may be provided without the need of equipment invest.

Figure 20:
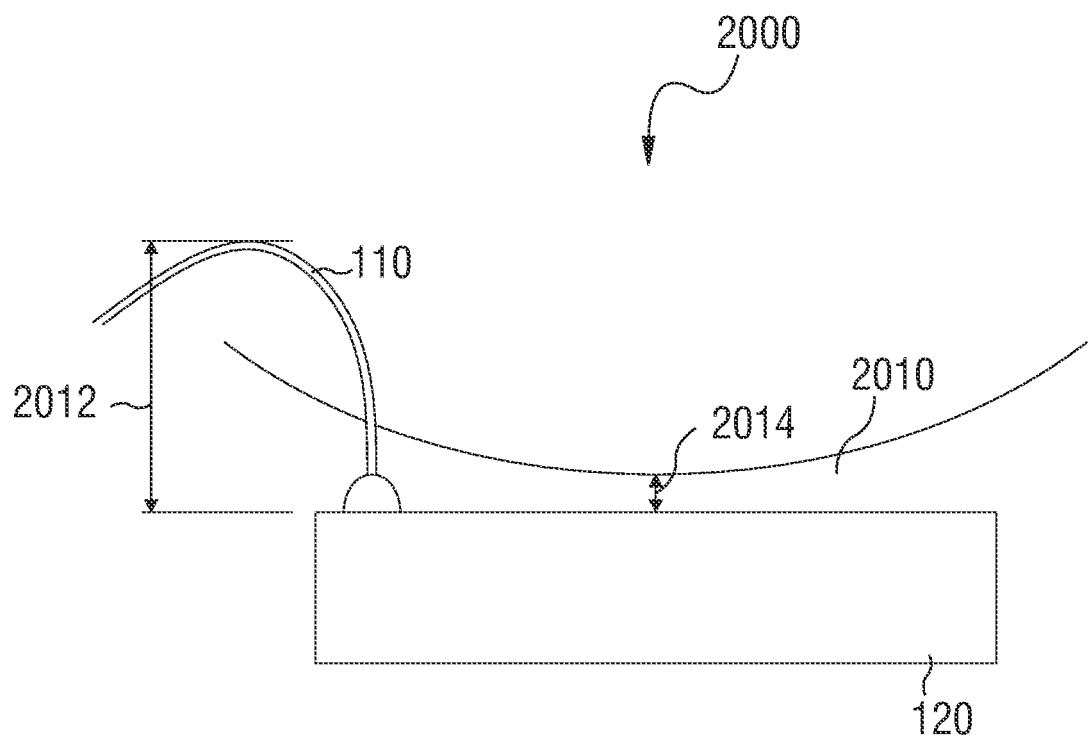
FIG. 20 shows a schematic illustration of a cross section of a pressure sensor device.

FIG. 20 shows a schematic illustration of a cross section of a pressure sensor device. The pressure sensor device 2000 comprises a semiconductor die 120 of the pressure sensor device 2000 and a bond wire 110 of the pressure sensor device 2000. A maximal vertical distance 2012 between a part of the bond wire 110 and the semiconductor die 120 is larger than a minimal vertical distance 2014 between the semiconductor die 120 and a surface of a gel 2010 covering the semiconductor die 120.

By implementing a bond wire extending vertically far away from the semiconductor die and extending higher than a surface of the gel, an electric discharging through undesired parts of the semiconductor die or at the surface of the gel may be reduce or avoid. In this way, the ESD robustness of the semiconductor die and/or the pressure sensor device may be improved.

The maximal vertical distance between the bond wire 110 and the semiconductor die 120 may be measured between a part of the bond wire 110 having the largest vertical distance to the semiconductor die 120 and an interface or boundary between the gel 2010 and the semiconductor die 120 (or a surface of a semiconductor substrate of the semiconductor die). For example, the maximal vertical distance 2012 between the part of the bond wire 110 and the semiconductor die 120 may be larger than 600 µm (or larger than 800 µm or larger than 1 mm) and/or less than 5 mm (or less than 2 mm or less than 1 mm).

The minimal vertical distance 2014 between the semiconductor die 120 and a surface of a gel 2010 may be measured between a part of the surface of the gel 2010 having the smallest vertical distance to the semiconductor die 120 and the interface or boundary between the gel 2010 and the semiconductor die 120 (or the surface of the semiconductor substrate of the semiconductor die). For example, the minimal vertical distance 2014 between the semiconductor die 120 and the surface of the gel 2010 may be larger than 1 µm (or larger than 5 µm or larger than 10 µm) and/or less than 200 µm (or less than 100 µm or less than 50 µm).

The maximal vertical distance and the minimal vertical distance may be measured orthogonal to a (frontside or backside) surface of a semiconductor substrate of the semiconductor die.

For example, the maximal vertical distance 2012 between the part of the bond wire 110 and the semiconductor die 120 is larger than two times (or larger than 5 times or larger than 10 times) the minimal vertical distance 2014 between the semiconductor die 120 and the surface of the gel 2010.

A cavity may be located adjacent to the gel 2010 covering the semiconductor die 120. The surface of the gel may be a boundary between the gel 2010 and the cavity. The gel may cover the gel so that the cavity does not reach the semiconductor die 120. In this way, the gel may protect the semiconductor die (e.g. from moisture), but may still allow that pressure is applied to the semiconductor die through the cavity. For example, at least a portion of the bond wire (e.g. at least the part having the largest vertical distance to the semiconductor die) may be located within the cavity.

For example, at least a portion of the bond wire 110 may be located outside the gel (e.g. within the cavity). Alternatively, the bond wire may be covered by a gel thin film. The gel thin film may comprise a thickness of less than 5 µm (or less than 2 µm or less than 1 µm). For example, a gel spray may be used to cover the semiconductor die with gel, which may cover (e.g. completely cover) the bond wire with the gel thin film as well.

The semiconductor die 120 may comprise a membrane structure. The membrane structure (e.g. micro-electro-mechanical system MEMS membrane structure) may be configured to be deformed due to a change of a present gas pressure. For example, no bond wire of the pressure sensor device 2000 may overlap the membrane structure in a top view of the semiconductor die 120. In this way, an easy and/or automatic optical inspection of the membrane structure may be possible even after bonding the bond wire 110 to the semiconductor die 120. For example, easier manufacturability may be enabled, compared to a cross-bond device. The optical line of sight to the MEMS from above may be cleared (unobstructed) to allow for some production test measurements (e.g. gel height measurement).

The semiconductor die 120 may comprise a first bond pad and an end of the (first) bond wire 110 may be bonded to the first bond pad of the semiconductor die 120.

The semiconductor die 120 may further comprise a second bond wire bonded to a second bond pad of the semiconductor die 120. For example, a lateral distance between the first bond pad and the second bond pad may be larger than half of a lateral dimension of the semiconductor die 120.

The pressure sensor device 2000 may comprise a package structure (e.g. lead frame) comprising a bond pad and an end of the (first) bond wire 110 may be bonded to the bond pad of the package structure.

The first bond pad and/or the second bond pad of the semiconductor die 120 and/or the bond pad of the package structure may be a reference voltage pad (e.g. ground pad).

For example, the first bond pad and/or the second bond pad may be a corner bond pad. A corner bond pad may be a bond pad closer to a corner of the semiconductor die 120 than any other bond pad of the semiconductor die 120. For example, a rectangular or square-shaped semiconductor die may comprise four corner pads.

More details and aspects are mentioned in connection with the embodiments described above or below. The embodiment shown in FIG. 20 may comprise one or more optional additional features corresponding to one or more aspects mentioned in connection with the proposed concept or one or more embodiments described above (e.g. FIGS. 1-19) or below (e.g. FIGS. 21-25).

Figure 21:
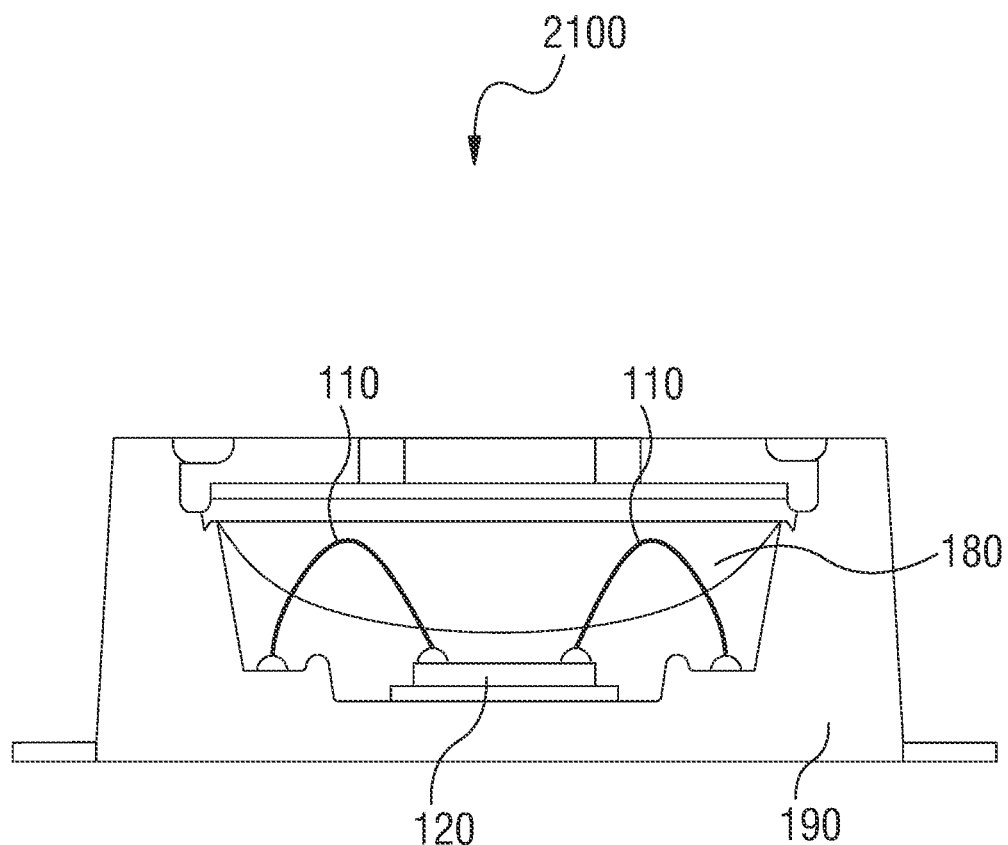
FIG. 21 shows a schematic illustration of a cross section of a pressure sensor device comprising two bond wires with high loop.
Figure 22:
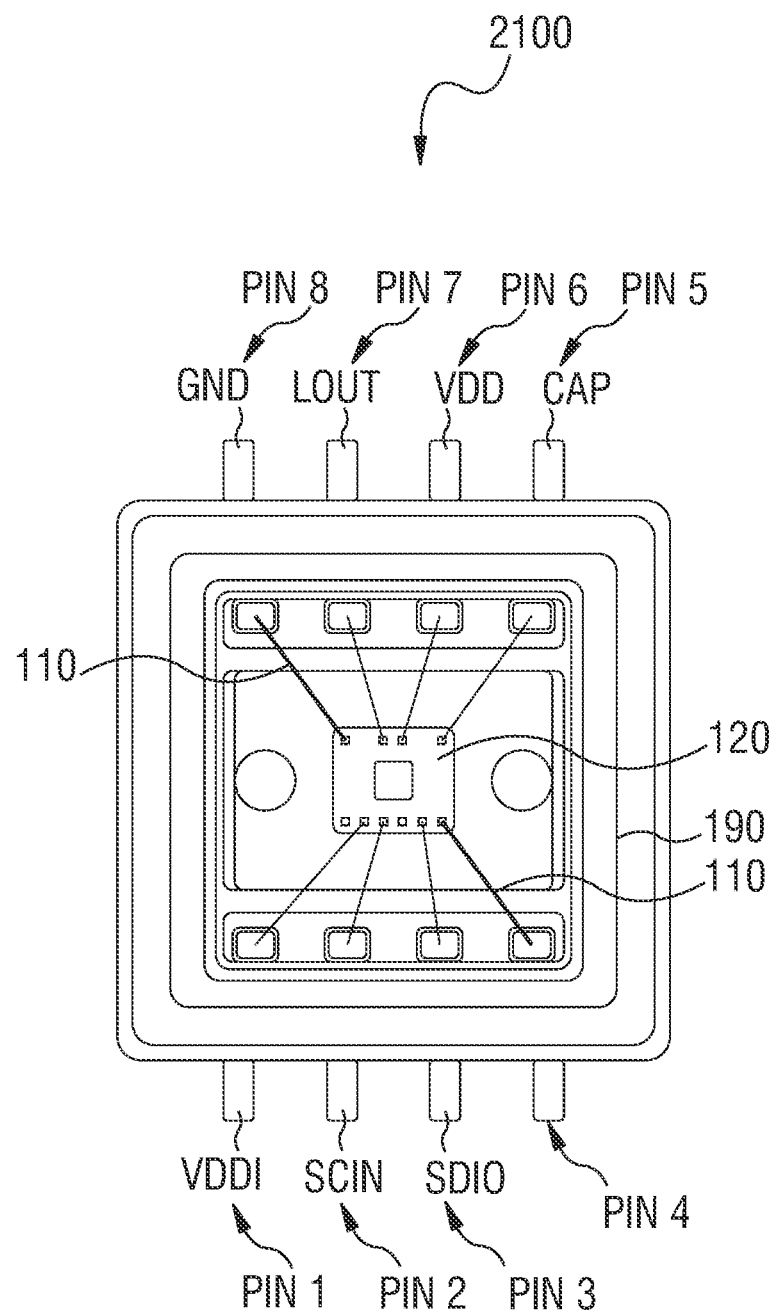
FIG. 22 shows a schematic illustration of a top side of the pressure sensor device of FIG. 21.

FIGS. 21 and 22 show schematic illustrations of a pressure sensor device 2100 comprising two bond wires 110 with high loop bonded to opposite corner pads of the semiconductor die 120 of the pressure sensor device 2100. The implementation of the pressure sensor device 2100 may be similar to the implementation described in connection with FIG. 20.

More details and aspects are mentioned in connection with the embodiments described above or below. The embodiment shown in FIG. 20 may comprise one or more optional additional features corresponding to one or more aspects mentioned in connection with the proposed concept or one or more embodiments described above (e.g. FIGS. 1-20) or below (e.g. FIGS. 23-25).

Figure 23:
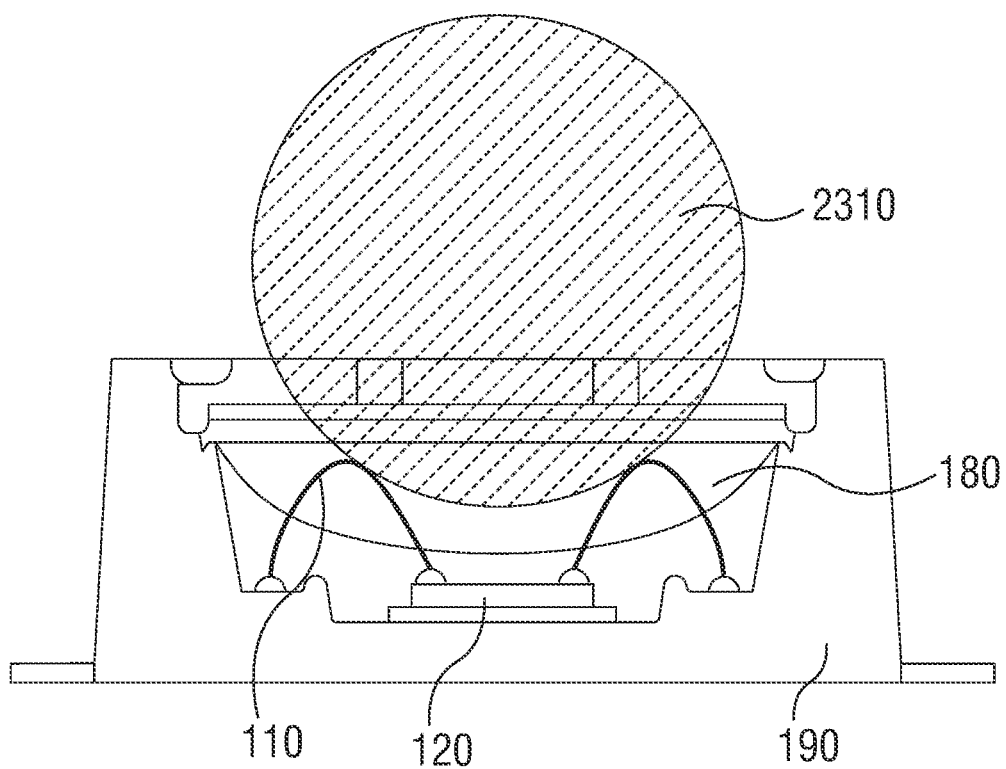
FIG. 23 shows a schematic illustration of a cross section of a pressure sensor device and a spherical equipotential surface.
Figure 24:
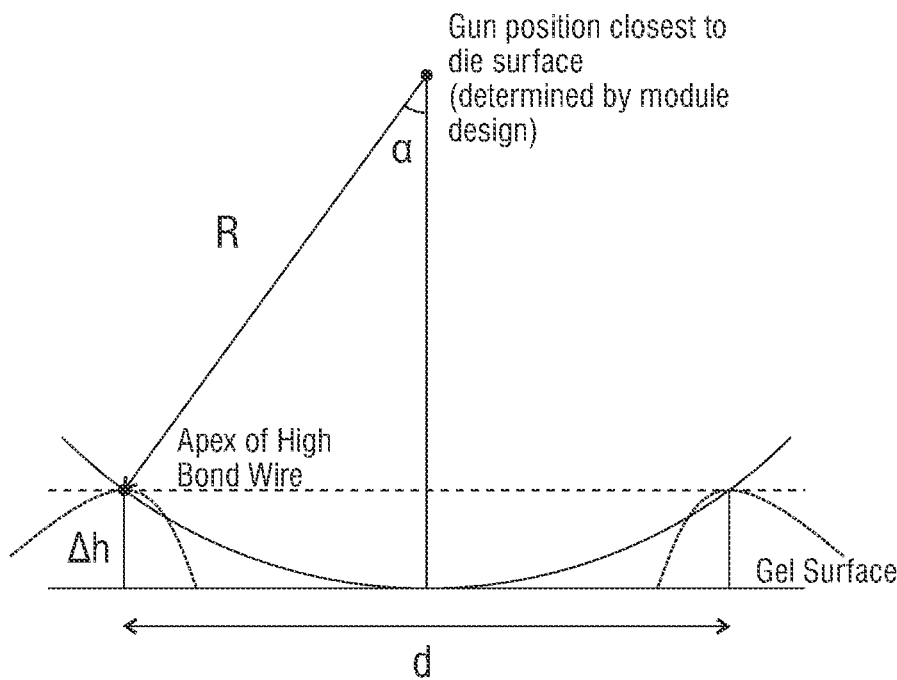
FIG. 24 shows a schematic illustration of a spherical equipotential surface reaching high bond wires.

FIG. 23 shows a schematic illustration of a cross section of a pressure sensor device and a spherical equipotential surface 2310 and FIG. 24 shows a schematic illustration of a spherical equipotential surface reaching high bond wires. Some factors and/or criteria for effectiveness may be the lightning ball shape, the lightning ball radius, the distance between the lightning rods (e.g. apexes of the bond wires) and/or the height of bond wires above gel surface. The lightening ball has the center around the gun tip, if the chip is not mounted in a second level package (module). However, mounting the chip in a module may bend the electric field lines and the equipotential surface is not perfectly spherical anymore, which makes a numerical criterion outside a specific module configuration difficult. The closer the gun tip can get to the sensor IC (integrated circuit), the smaller may be the lightning ball and the harder may be the protection of the die (e.g. a denser network of lightning poles may be used). The closer the high bond wires, the more gel volume between them may be protected. Also, the high bond wires may be spread uniformly throughout the gel surface. The higher the bond wires, the better may be the protection.

A simplified numerical criterion for two corner bonds may be illustrated by FIG. 24. A spherical lightning ball is assumed and the lightning ball is above the gel. At the limit the lightning ball touches the gel and the condition may be:

$$\Delta h > R*(1-\mathrm{sqrt}(1-(d/2R)^2))$$

with d being the distance between the apexes of the high bond wires, R being the radius of the spherical lightning ball and $\Delta h$ being the difference between the maximal vertical distance between apex of the bond wire and the semiconductor die and the minimal vertical distance between the semiconductor die and the surface of the gel covering the semiconductor die.

Figure 25:
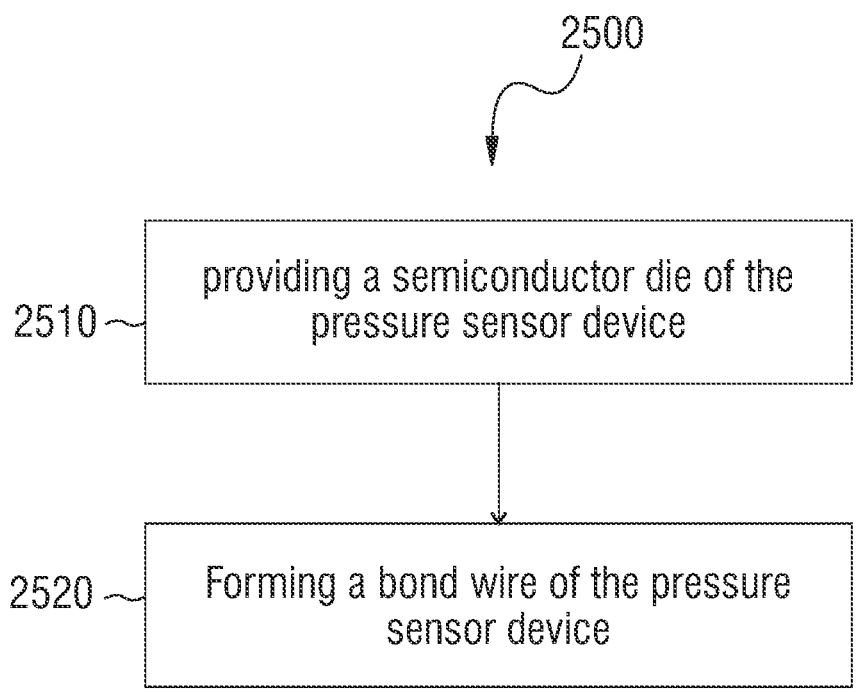
FIG. 25 shows a flow chart of a method for manufacturing a pressure sensor device.

FIG. 25 shows a flow chart of a method for forming a pressure sensor device. The method 2500 comprises providing 2510 a semiconductor die of the pressure sensor device and forming 2520 a bond wire of the pressure sensor device. A maximal vertical distance between a part of the bond wire and the semiconductor die is larger than a minimal vertical distance between the semiconductor die and a surface of a gel covering the semiconductor die.

By implementing a bond wire extending vertically far away from the semiconductor die and higher than a surface of the gel, an electric discharging through undesired parts of the semiconductor die or at the surface of the gel may be reduce or avoid. In this way, the ESD robustness of the semiconductor die and/or the pressure sensor device may be improved.

More details and aspects are mentioned in connection with the embodiments described above or below. The embodiment shown in FIG. 20 may comprise one or more optional additional features corresponding to one or more aspects mentioned in connection with the proposed concept or one or more embodiments described above (e.g. FIGS. 1-24) or below.

Some embodiments relate to the implementation of high corner bonds (e.g. two or more corner bonds) not extending or crossing the die. For example, more lightning poles (>=2) implemented by the bond wires may be used to increase the ESD-protected volume under them, to be able to protect the MEMS and the gel above it even if the lightning pole does not cross above the MEMS. For example, high bond-wires designed with a higher apex may be implemented to meet a sufficient criteria. Additionally or alternatively, lead frame sections or any other system of two or more grounded conductive metal parts that meet this function and arrangement may be used.

The lightning ball for testing the pole-system effectiveness may be an imaginary ball with an equipotential surface inside which lightning can occur. The area bellow the tips of the poles may be protected (e.g. has low risk of lightning) because the electrical potential and the electric field are much lower. By using a cross bond (e.g. FIG. 1), the gel volume over the die can be protected by the cross-bond. The lightening ball (e.g. the equipotential surface around the gun tip) might not touch the surface of the gel above the die (the sensitive area) due to the cross bond.

With a single high corner bond that is easy to manufacture, the lightning ball still may touch the gel surface above the die. To be effective, the height of a single high corner bond may go beyond easily manufacturable values (e.g. the wire may intersect the plastic package).

Therefore, two or more high corner bonds may be used. The gel volume over the die may be protected by the two high corner bonds (e.g. FIG. 23). In this way, the lightening ball (e.g. the equipotential surface around the gun tip) might not touch the surface of the gel above the die (e.g. the sensitive area).

The height of the bond wires can be measured in an x-ray picture with the profile of the high corner bond wires, added markers for gel surface and a vertical ruler to gauge the bond apex height. For example, depending on the die size of the semiconductor die, a 600 µm high bond wire might not provide sufficient protection, while a 800 µm high bond wire may provide a significantly reduced risk of ESD damage of the device.

The aspects and features mentioned and described together with one or more of the previously detailed examples and figures, may as well be combined with one or more of the other examples in order to replace a like feature of the other example or in order to additionally introduce the feature to the other example.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A pressure sensor device, comprising:
   a semiconductor die having a first die surface that comprises a pressure sensor area and a second die surface arranged opposite to the first die surface; and
   a bond wire bonded to a first peripheral region of the first die surface and extends over the first die surface to a second peripheral region of the first die surface, wherein the pressure sensor area is interposed between the second peripheral region and the first peripheral region, wherein the bond wire comprises a crossing portion that overlaps an area of the first die surface, wherein the crossing portion extends over the pressure sensor area that is interposed between the first and the second peripheral regions, and wherein the crossing portion is closer to the pressure sensor area than to the second die surface,
   wherein the second peripheral region is catty-corner to the first peripheral region and the crossing portion extends diagonally over the pressure sensor area that is diagonally interposed between the first and the second peripheral regions, or
   wherein the second peripheral region is arranged laterally opposite to the first peripheral region with respect to the pressure sensor area, wherein the pressure sensor area has a first lateral side and a second lateral side arranged opposite to the first lateral side, and wherein the crossing portion extends laterally over the pressure sensor area that is laterally interposed between the first and the second peripheral regions such that the crossing portion extends over the first lateral side and the second lateral side of the pressure sensor area.

2. The pressure sensor device of claim 1, further comprising:
   a gel that covers the semiconductor die and a portion of the bond wire, wherein the gel comprises a gel surface that provides an interface between the gel and a cavity in which the semiconductor die resides.

3. The pressure sensor device of claim 2, wherein:
   the gel has a minimal vertical distance between the first die surface and the gel surface, and
   a maximal vertical distance between a part of the bond wire and the first die surface is larger than the minimal vertical distance between the first die surface and the gel surface of the gel covering the semiconductor die.

4. The pressure sensor device of claim 1, wherein a length of the crossing portion is longer than half of a dimension of the semiconductor die.

5. The pressure sensor device of claim 4, wherein an intermediate contact portion of the bond wire is bonded to a bond pad of the semiconductor die.

6. The pressure sensor device of claim 4, wherein the semiconductor die comprises a membrane structure configured to be deformed by a present gas pressure, wherein the crossing portion of the bond wire extends across the membrane structure.

7. The pressure sensor device of claim 4, wherein the length of the crossing portion is larger than the dimension of the semiconductor die.

8. The pressure sensor device of claim 1, wherein a first end of the bond wire is bonded to a bond pad of the semiconductor die and a second end of the bond wire is an open end.

9. The pressure sensor device of claim 1, wherein the bond wire is configured to attract an electrostatic discharge (ESD) charge and dissipate at least part of the ESD charge.

10. A method of manufacturing a pressure sensor device, the method comprising:
    forming a semiconductor die of the pressure sensor device, the semiconductor die having a first die surface that comprises a pressure sensor area interposed between a first peripheral region of the first die surface and a second peripheral region of the first die surface, the semiconductor die having a second die surface arranged opposite to the first die surface; and bonding a bond wire to the first peripheral region and extending the bond wire to the second peripheral region, wherein the bond wire extends over the first die surface from the first peripheral region to the second peripheral region, wherein the bond wire comprises a crossing portion that overlaps an area of the first die surface, and wherein the crossing portion extends over the pressure sensor area that is interposed between the first and the second peripheral regions, and wherein the crossing portion is closer to the pressure sensor area than to the second die surface, wherein the second peripheral region is catty-corner to the first peripheral region and the crossing portion extends diagonally over the pressure sensor area that is diagonally interposed between the first and the second peripheral regions, or wherein the second peripheral region is arranged laterally opposite to the first peripheral region with respect to the pressure sensor area, wherein the pressure sensor area has a first lateral side and a second lateral side arranged opposite to the first lateral side, and wherein the crossing portion extends laterally over the pressure sensor area that is laterally interposed between the first and the second peripheral regions such that the crossing portion extends over the first lateral side and the second lateral side of the pressure sensor area.

11. The method of claim 10, further comprising:
bonding the bond wire to the second peripheral region.

12. The method of claim 10, further comprising:
depositing a gel that covers the semiconductor die and a portion of the bond wire, wherein the gel comprises a gel surface that provides an interface between the gel and a cavity in which the semiconductor die resides.

13. The method of claim 12, wherein:
the gel has a minimal vertical distance between the first die surface and the gel surface, and
a maximal vertical distance between a part of the bond wire and the first die surface is larger than the minimal vertical distance between the first die surface and the gel surface of the gel covering the semiconductor die.

14. The method of claim 10, wherein the bond wire is configured to attract an electrostatic discharge (ESD) charge and dissipate at least part of the ESD charge.

* * * * *